US009368142B2

(12) United States Patent
Chen et al.

(10) Patent No.: US 9,368,142 B2
(45) Date of Patent: Jun. 14, 2016

(54) MAGNETIC STACK INCLUDING TIN-X INTERMEDIATE LAYER

(71) Applicant: Seagate Technology LLC, Cupertino, CA (US)

(72) Inventors: Jingsheng Chen, Singapore (SG); Huihui Li, Singapore (SG); Ganping Ju, Pleasanton, CA (US); Yingguo Peng, San Ramon, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 77 days.

(21) Appl. No.: 14/035,931

(22) Filed: Sep. 24, 2013

(65) Prior Publication Data

US 2014/0093748 A1 Apr. 3, 2014

Related U.S. Application Data

(60) Provisional application No. 61/706,314, filed on Sep. 27, 2012, provisional application No. 61/706,317, filed on Sep. 27, 2012, provisional application No. 61/733,202, filed on Dec. 4, 2012.

(51) Int. Cl.

| G11B 5/66 | (2006.01) |
|---|---|
| G11B 5/738 | (2006.01) |
| C23C 14/14 | (2006.01) |
| C23C 14/08 | (2006.01) |
| C23C 14/06 | (2006.01) |
| G11B 5/73 | (2006.01) |
| G11B 5/65 | (2006.01) |
| G11B 5/667 | (2006.01) |

(52) U.S. Cl.
CPC ............ *G11B 5/738* (2013.01); *C23C 14/0641* (2013.01); *C23C 14/08* (2013.01); *C23C 14/14* (2013.01); *G11B 5/7325* (2013.01); *G11B 5/65* (2013.01); *G11B 5/667* (2013.01)

(58) Field of Classification Search
None
See application file for complete search history.

(56) References Cited

U.S. PATENT DOCUMENTS

| 4,738,885 A | 4/1988 | Matsumoto |
| 5,635,269 A | 6/1997 | Weir et al. |
| 6,194,045 B1 | 2/2001 | Annacone et al. |
| 2006/0154110 A1* | 7/2006 | Hohlfeld et al. ............. 428/823 |
| 2006/0222902 A1* | 10/2006 | Mukai ...................... G11B 5/66 428/827 |

(Continued)

FOREIGN PATENT DOCUMENTS

| EP | 0520157 | 12/1992 |
| JP | 2008293559 | 12/2008 |

(Continued)

OTHER PUBLICATIONS

Dong et al., "Well-Isolated L10 FePt—SiNx—C Nanocomposite Films with Large Coercivity and Small Grain Size", Journal of Applied Physics, 111, 2012, 07A308-1-07A308-3.

(Continued)

*Primary Examiner* — Holly Rickman
*Assistant Examiner* — Linda Chau
(74) *Attorney, Agent, or Firm* — Hollingsworth Davis, LLC

(57) ABSTRACT

A magnetic stack includes a substrate, a magnetic recording layer, and a TiN—X layer disposed between the substrate and the magnetic recording layer. In the TiN—X layer, X is a dopant comprising at least one of MgO, TiO, $TiO_2$, ZrN, ZrO, $ZrO_2$, HfN, HfO, AlN, and $Al_2O_3$.

20 Claims, 35 Drawing Sheets

(56) References Cited

U.S. PATENT DOCUMENTS

| | | | |
|---|---|---|---|
| 2008/0292909 A1* | 11/2008 | Igarashi et al. | 428/846.5 |
| 2009/0155628 A1* | 6/2009 | Lee et al. | 428/828 |
| 2010/0159285 A1* | 6/2010 | Peng et al. | 428/832 |
| 2011/0235479 A1 | 9/2011 | Kanbe et al. | |

FOREIGN PATENT DOCUMENTS

| | | |
|---|---|---|
| WO | WO9858367 | 12/1998 |
| WO | WO2012086335 | 6/2012 |

OTHER PUBLICATIONS

Li et al., "High Coercive FePt and FePT—SiNx(001) Films with Small Grain Size and Narrow Opening-Up of In-Plane Hysteresis Loop by TiN Intermediate Layer", Journal of Applied Physics, 110, 2011, 043911-1-043911-4.

Kryder et al., "Heat Assisted Magnetic Recording", Proceedings of the IEEE, vol. 96, No. 11, Nov. 2008, 26 pages.

International Search Report and Written Opinion dated Dec. 27, 2013 from PCT Application No. PCT/US2013/061505, 10 pages.

* cited by examiner

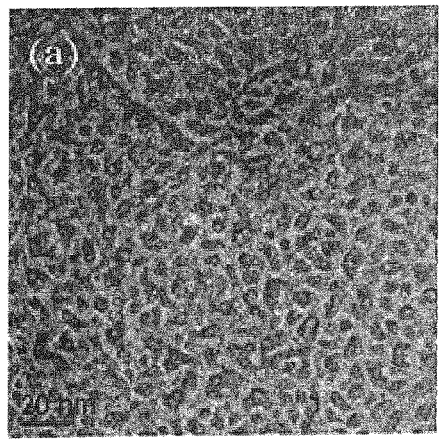 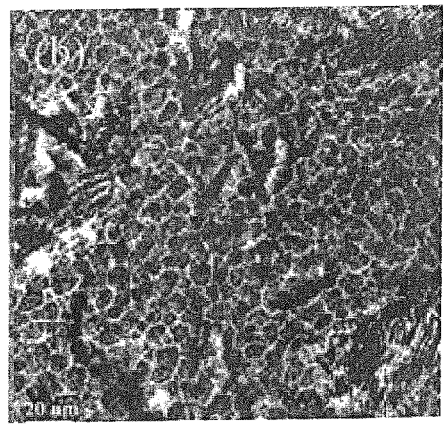
*Fig. 16a*  *Fig. 16b*
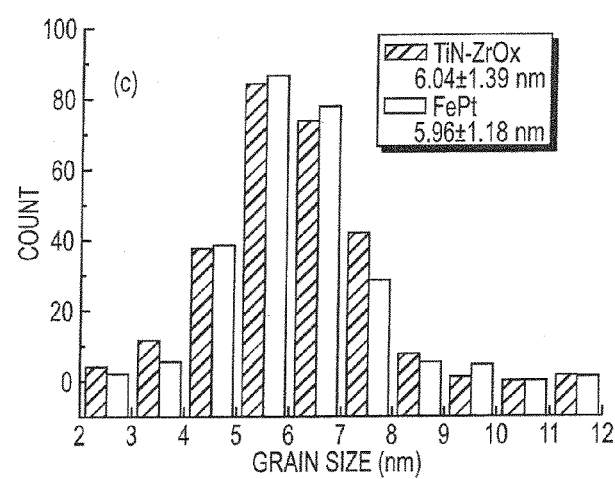
*Fig. 16c*

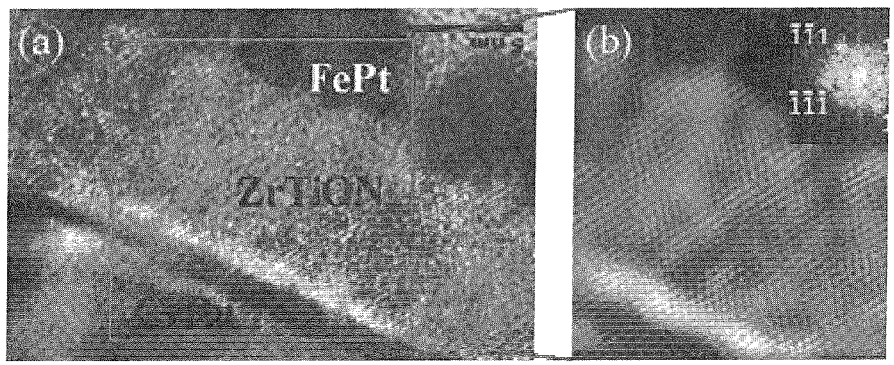
*Fig. 17a*  *Fig. 17b*
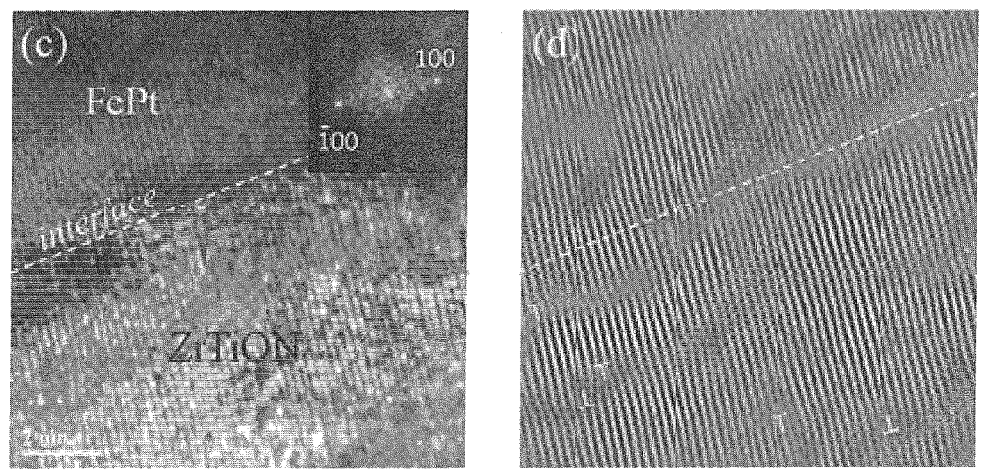
*Fig. 17c*  *Fig. 17d*

MAGNETIC STACK INCLUDING TIN-X INTERMEDIATE LAYER

RELATED APPLICATIONS

This application claims the benefit of Provisional Patent Application Ser. No. 61/706,314 filed on Sep. 27, 2012; Provisional Patent Application Ser. No. 61/706,317 filed on Sep. 27, 2012; and Provisional Patent Application Ser. No. 61/733,202 filed on Dec. 4, 2012, to which priority is claimed pursuant to 35 U.S.C. §119(e) and which are hereby incorporated herein by reference in their entireties.

SUMMARY

Embodiments discussed herein involve a stack that includes a substrate, a magnetic recording layer, and a TiN—X layer disposed between the substrate and the magnetic recording layer. For example, in the TiN—X layer, X is a dopant comprising at least one of MgO, TiO, $TiO_2$, ZrN, ZrO, $ZrO_2$, HfN, HfO, AlN, and $Al_2O_3$.

BRIEF DESCRIPTION OF THE DRAWINGS

FIG. 16a illustrates planar view TEM images of the TiN—$ZrO_x$ 30 vol. % without a 10 nm FePt magnetic layer;

FIG. 16b shows planar view TEM images of the TiN—$ZrO_x$ 30 vol. % with a 10 nm FePt magnetic layer;

FIG. 16c shows that the grain size distribution of pure FePt film grown on TiN-30 vol. % $ZrO_x$ intermediate layer was consistent with that of ZrTiON intermediate layer;

FIG. 17a-17d show high resolution TEM images of CrRu (30 nm)/TiN (5 nm)-$ZrO_x$ 40 vol. %/FePt (10 nm) film;

DETAILED DESCRIPTION

Heat assisted magnetic recording (HAMR) has the ability to extend the areal density of magnetic recording due to the high magnetocrystalline anisotropy of the materials used in the recording layer. In order to form the HAMR media, one or more sublayers can be used to orient and/or control the grain size of the high anisotropy magnetic recording layer. For example, for recording layers comprising FePt, these sublayers can be used to induce the L10 (001) texture of the FePt film. The microstructures of FePt (or other magnetic layers) depend on sublayers immediately below which play a role in controlling the microstructures of the magnetic layer such as c-axis dispersion and grain size. For example, the sublayers may provide one or more of the following properties: 1) suitable lattice structure for magnetic layer epitaxial growth; 2) chemical stability and diffusion barrier; and 3) proper surface properties for controlling the grain size and crystalline orientation of magnetic layer.

Embodiments discussed herein involve the use of a TiN—X layer arranged in the magnetic stack between the substrate and the magnetic recording layer. The TiN—X layer may provide at least some of the properties set forth above for the magnetic recording layer. In addition to promoting the orientation of the magnetic layer epitaxial growth (e.g., FePt (001) epitaxial growth), the TiN—X layer can support granular two-phase growth of the magnetic recording layer. Furthermore, the TiN—X layer may also provide a specified amount of thermal conductivity and/or may serve to block interdiffusion between the magnetic layer(s) disposed on one side of the TiN—X layer and layers disposed on the opposite side of the TiN—X layer.

According to various implementations, a TiN—X intermediate layer comprises TiN and at least one doping material X, where X may comprise one or more of MgO, TiO, $TiO_2$, ZrN, ZrO, $ZrO_2$, HfN, HfO and $HfO_2$, AlN and $Al_2O_3$. In some cases, the dopant X may be a material for which the heat of formation of corresponding metallic nitrides at 298K is not less than 338 kJ/g-atom metal for TiN. In some embodiments, the TiN—X layer is used in conjunction with a soft magnetic underlayer comprising one or more of CrRu and MgO.

Figure 1A:
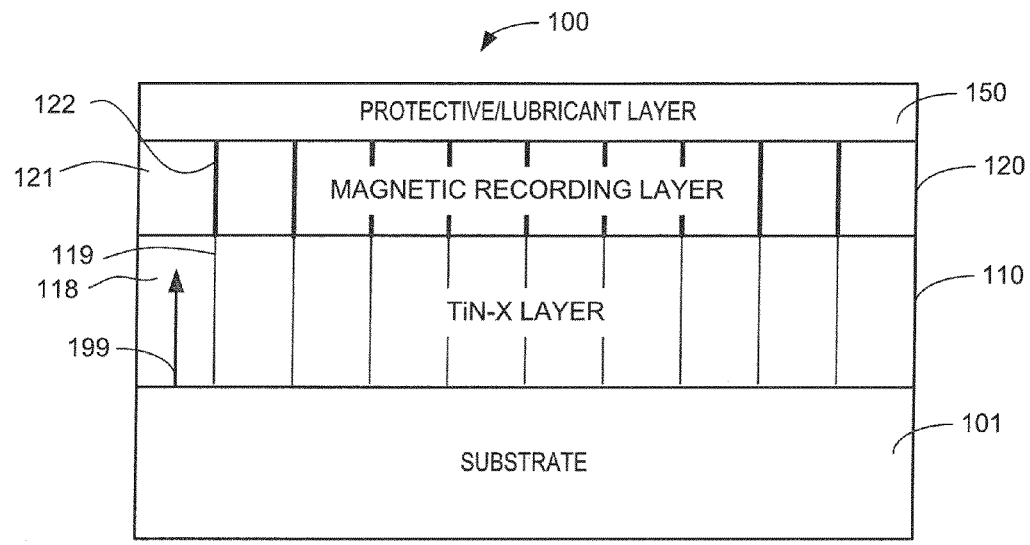
FIGS. 1a, 1b, 2a, and 2b are cross sectional diagrams of magnetic stacks in accordance with embodiments discussed herein.

FIG. 1a illustrates a magnetic stack 100 that includes a TiN—X layer 110. The TiN—X layer underlies a magnetic recording layer 120 in the stack 100. As shown in FIG. 1, the TiN—X layer is disposed between the substrate 101 and the magnetic recording layer 120. A protective overcoat or lubricant layer 150 may be disposed on the magnetic recording layer 120. The magnetic recording layer 120 is a granular two-phase layer. The first phase of the magnetic recording layer 120 comprises magnetic grains 121 and the second phase comprises non-magnetic segregant 122 disposed between the grain boundaries of the magnetic grains 121. The non-magnetic segregant 122 may comprise one or more of C, $SiO_2$, $Al_2O_3$, $Si_3N_4$, BN, or another alternative oxide, nitride, boride, or carbide material. Suitable materials for the magnetic grains 121 include, for example FePt, FeXPt alloy, FeXPd alloy, Co3Pt. Although any of these materials in various combinations may be used for the magnetic layer 120, the examples provided herein focus on FePt as the magnetic recording layer material. In some configurations, the magnetic recording layer comprises magnetic crystalline grains of FePt and a non-magnetic segregant comprising $SiO_x$ and C disposed between the crystalline grains. The magnetic layer may comprise $SiO_x$ in an amount between about 35 and about 45 vol. % and C in an amount of about 20 vol. %.

The TiN—X layer 110 comprises TiN and a dopant X. TiN is a type of interstitial nitride ceramic having f.c.c lattice structure. The lattice misfit between TiN and FePt is 9.5%, a little larger than that of MgO. An orientation relationship of FePt (001)<001>||TiN (100)<001>||Si(100)<001> can be established when FePt is grown on TiN. However, the wetting contact between FePt and undoped TiN may make it difficult to reduce FePt grain size by doping the FePt with a segregant material. However this concern can be mitigated when TiN is doped with X to form the TiN—X layer 110. The TiN—X layer 110 may comprise a two phase granular layer having TiN—X and/or TiN grains 118 and where at least some of the X material is disposed at the grain boundaries 119 of the TiN—X and/or TiN grains 118.

The dopant X in the TiN—X layer 110 may include one or more of MgO, TiO, $TiO_2$, ZrN, ZrO, $ZrO_2$, HfN, HfO and $HfO_2$, AlN and $Al_2O_3$, for example. The TiN—X layer may have a thickness in a range of about 2 nm to about 40 nm or greater than or equal to about 30 nm. The thickness of the TiN—X layer may be selected to provide specified thermal design criteria. As one example of a TiN—X layer, X may be $TiO_2$ where the $TiO_2$ is present in the TiN—X layer in an amount greater than 0 and less than or equal to about 40 vol. %. When X is $TiO_2$, the composition of the TiN—X layer 110 may be $TiO_{0.45}N_{0.55}$. In this case, the magnetic recording layer may include magnetic crystalline grains (see, element 121 of FIG. 1) that an average diameter in the plane of the magnetic layer that is less than about 8.5 nm.

The amount of dopant in the TiN—X layer may vary with distance from the substrate as indicated by arrow 199, where the arrow 199 points in the direction of increasing dopant. For example, the amount of X may vary from 0% near the substrate 101 to about 30% or 40% near the magnetic recording layer 120.

As another example of a TiN—X layer, X may be $ZrO_2$ where the $ZrO_2$ is present in the TiN—X layer in an amount greater than 0 and less than or equal to about 30 vol. %. In this example, the magnetic recording layer may include magnetic crystalline grains 121 that have an average diameter in the plane of the magnetic layer that is less than about 6 nm.

Figure 1B:
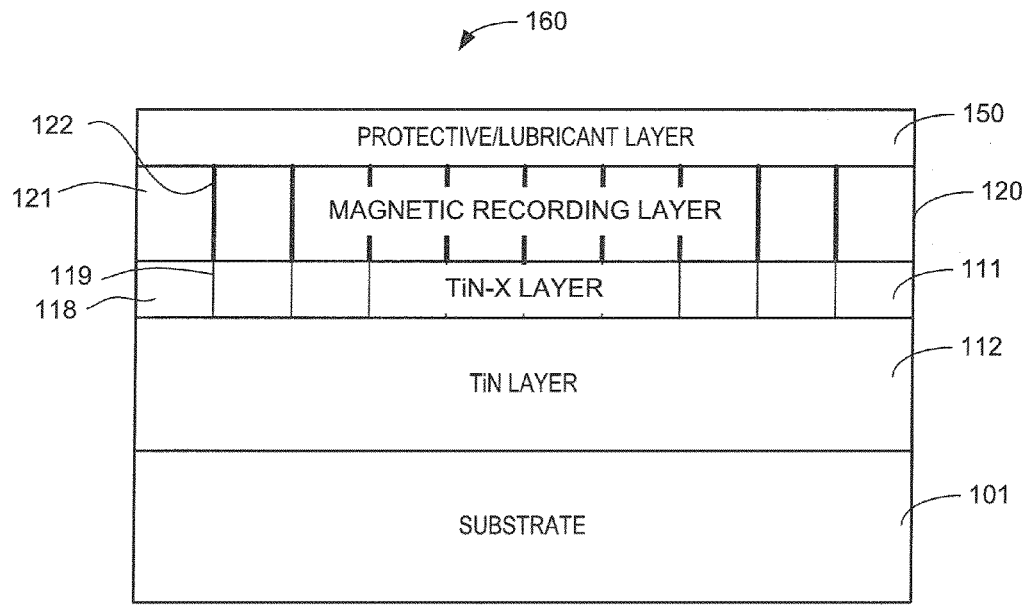

In some embodiments, the magnetic stack may include a doped TiN—X layer 111 and an undoped TiN layer 112 as illustrated in FIG. 1b. The undoped TiN layer 112 is disposed between the underlayer 205 and the TiN—X layer 111. In some configurations that use the TiN and TiN—X layers, the TiN layer may have a thickness of about 2 nm and the TiN—X layer may have a thickness of about 3 nm. The TiN—X layer 111 may comprise a two phase granular layer having grains TiN—X and/or TiN grains 118 and where the at least some of the X material is disposed at the grain boundaries 119 of the TiN—X and/or TiN grains 118.

Figure 2A:
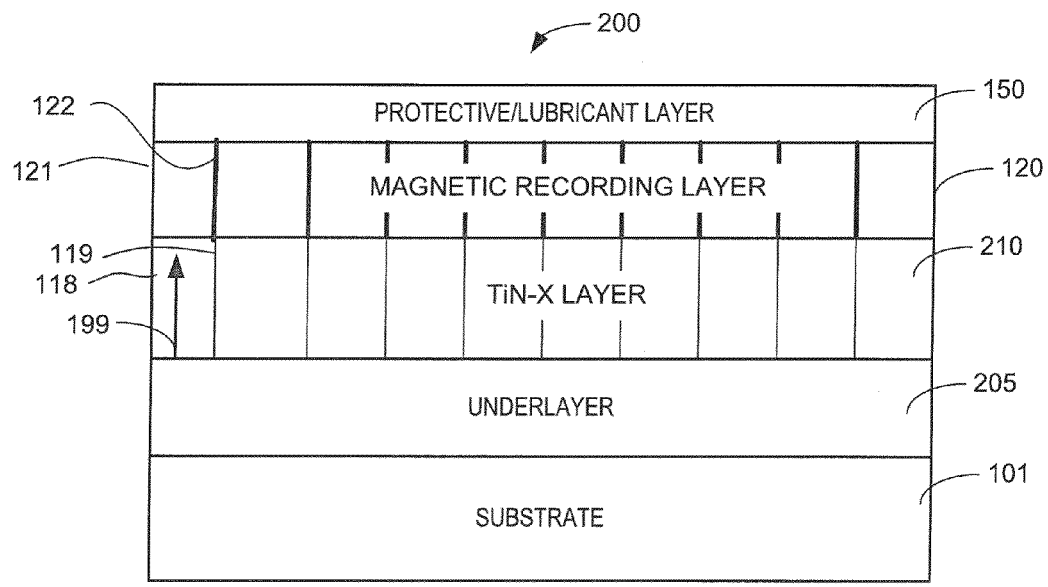

FIG. 2a shows another magnetic stack 200 that includes a TiN—X layer 210 used in conjunction with underlayer 205. The underlayer 205 may comprise multiple separate material layers and/or may comprise one layer that performs several functions. For example, the underlayer may provide a soft magnetic underlayer or heat sink. The underlayer may comprise MgO or CrRu, for example. As previously discussed, the TiN—X layer is doped with X, which may comprise one or more of MgO, TiO, TiO2, ZrN, ZrO, $ZrO_2$, HfN, HfO and $HfO_2$AlN and $Al_2O_3$. When the TiN—X layer is used in conjunction with the underlayer 205, the thickness of the TiN—X layer may be about 5 nm to about 10 nm.

As previously the TiN—X layer 111 may comprise a two phase granular layer having grains TiN—X and/or TiN grains 118 and where the at least some of the X material is disposed at the grain boundaries 119 of the TiN—X and/or TiN grains 118.

The amount of dopant in the TiN—X layer may vary with distance from the substrate as indicated by arrow 199, where the arrow 199 points in the direction of increasing dopant. For example, the amount of X may vary from 0% near the substrate 101 to about 30% or 40% near the magnetic recording layer 120.

Figure 2B:
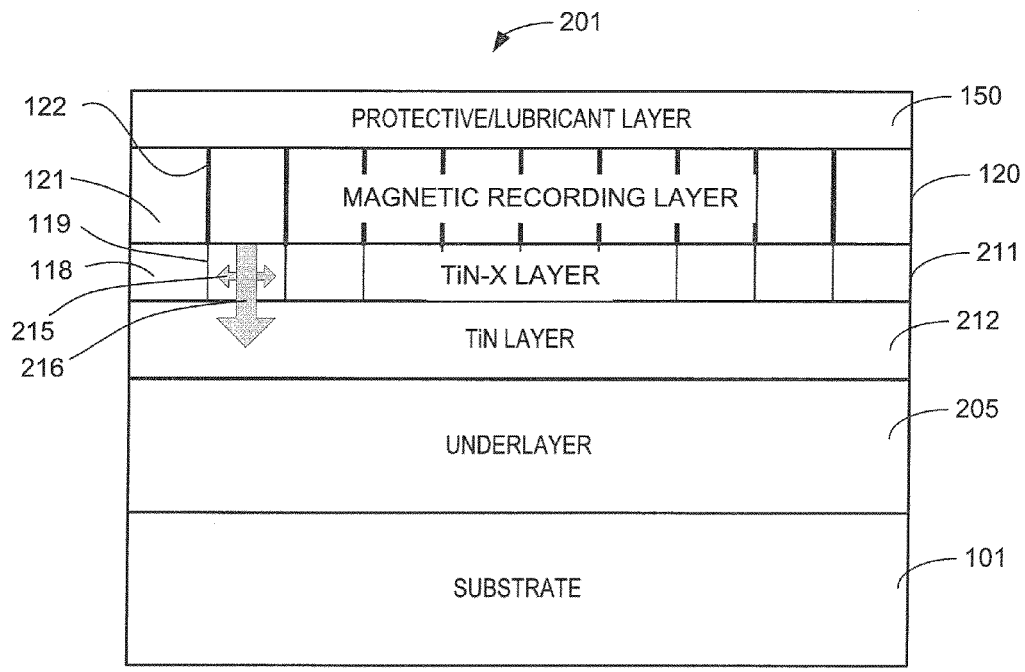

As depicted in FIG. 2b, the magnetic stack 201 may include a doped TiN—X layer 211, along with an undoped TiN layer and an underlayer 205 as previously discussed. The undoped TiN layer is disposed between the underlayer 205 and the TiN—X layer. In some configurations that use the TiN and TiN—X layers, the TiN layer may have a thickness of about 2 nm and the TiN—X layer may have a thickness of about 3 nm.

The TiN—X layer 211 may comprise a two phase granular layer having grains TiN—X and/or TiN grains 118 and where the at least some of the X material is disposed at the grain boundaries 119 of the TiN—X and/or TiN grains 118.

Doping in the TiN—X layer leads to formation of solid solution grains 118 and amorphous material at the grain boundaries 119. In a particular embodiment, $ZrO_x$ doping in the TiN—X intermediate layer leads to the formation of ZrTiON solid solution grains and amorphous $ZrO_2$ segregation. Moreover, the granular TiN—X intermediate layer 211 is able to transfer the granular structure to the grains 121 of the magnetic recording layer 120, e.g., FePt, that were formed epitaxially on top of ZrTiON grains, and thus helps to control the grain size in the magnetic recording layer.

Additionally, the bilayer TiN/TiN—X structure 212/211 shown in FIG. 2b is favorable from a HAMR thermal design perspective. To provide optimal thermal gradient in the magnetic recording layer 120 (e.g., FePtX), a laterally thermally isolated interlayer 211 (e.g., $ZrTiON:ZrO_2$, where thermal isolation is due to the $ZrO_2$ amorphous grain boundaries) can be placed directly below the magnetic recording layer 120. In this configuration, the heat in the magnetic recording layer 120 is predominantly conducted vertically along arrow 216 to the (thermally conducting) TiN layer 212 and to the heat sink layer 205 underneath. The TiN—X layer 211 can partially serve as a thermal resistor layer which resists lateral heat conduction along arrow 215. The regions of oxide 119 in the TiN—X layer 211 have lower thermal conductivity when compared to TiN, thus the two phase TiN—X layer 211 resists lateral heat conduction. The laterally resistive TiN—X layer 211 reduces lateral thermal bloom in the magnetic recording layer 120 due to reheating from the heat sink or other thermally conductive interlayer. For example, the bilayer structure $ZrTiON:ZrO_2$/TiN provides superior thermal properties when compared to a TiN interlayer without the $ZrTiON:ZrO_2$ layer.

According to embodiments described herein, TiN—X layer can be fabricated by dc-sputtering of a composite target or by co-deposition of TiN and at least one from MgO, TiO, $TiO_2$, ZrN, ZrO, $ZrO_2$, HfN, HfO and $HfO_2$ AlN and $Al_2O_3$ using magnetron sputtering at elevated substrate temperature (400° C. or above). The doping concentration can be varied from 0 to 40 vol. %. If more than 40 vol. % dopant is added, deterioration of the interlayer orientation would likely occur. Because the nitrides, carbides and monoxides of three IV group elements Ti, Zr and Hf are isomorphs with similar chemical and physical properties and completely soluble to each other, the final TiN—X will be a solid solution of TiN and at least one of MgO, TiO, ZrN, ZrO, HfN, HfO, AlN and $Al_2O_3$. The (001) oriented fcc structure of TiN—X will be maintained to enable FePt (001) epitaxial growth. The surface properties of TiN—X modified by doping are more favorable for FePt granular growth and hence improve the grain size reduction. If there is oxygen content in doping, a little oxide such as $TiO_2$, $ZrO_2$, $Al_2O_3$ and/or $HfO_2$ will be formed at grain boundaries of columnar TiN—X underlayer/interlayer to enhance grain isolation and therefore the exchange decoupling of FePt grains.

Microstructural control of FePt thin films is considered for FePt alloy with high magnetocrystalline anisotropy for use in magnetic recording media. From a thermodynamic perspective, the intrinsic properties, i.e., surface property and lattice structure, of the layers underlying the magnetic recording layer may play a more important role in determining the microstructural properties such as grain size, texture and surface morphology of FePt thin films fabricated by epitaxial growth than the extrinsic methods, e.g., the doping the magnetic material with non-magnetic materials and/or the adjustment of deposition parameters. However, some materials used in the underlying layers may not achieve optimal balance between the microstructural requirements for the growth of the granular FePt thin film: epitaxial growth (large surface energy and small mismatch) and island growth (small surface energy and large mismatch). Therefore, it can be helpful if the properties of the underlying layers are capable of being intrinsically modulated towards meeting the criteria discussed above. For example, modulating the intrinsic properties of the TiN—X layer can be accomplished by varying the dopant X the TiN—X layer. In the case of X being $TiO_2$ or $ZrO_2$, for example, variation of X may produce a TiN—X comprising $TiO_xN_y$ or $ZrTiO_xN_y$, respectively. Note that x and y may be constant through the TiN—X layer or may vary with distance through at least a portion of the TiN—X layer.

TiN is attractive as an underlying material for $L1_0$ (001) FePt epitaxial growth, especially because of its performance as a diffusion barrier and its thermally conductive nature. FePt films grown on TiN exhibited a small openness of in-plane hysteresis loops due to its good wetting contact with FePt. However, it can be difficult to scale down the grain size of FePt films grown on TiN by adding dopant in the FePt layer, because the good wetting contact between FePt and TiN can cause the grain dopant to diffuse out. Moreover, the relative large lattice mismatch between TiN and FePt may be a cause for lattice relaxation which can result in the deterioration of the magnetic properties.

A number of examples discussed below involve TiN—X layers where X=$TiO_2$ ($TiO_xN_y$) or where X=$ZrO_2$ ($ZrTiO_xN_y$) used as interlayers that underlie the magnetic recording layer. The $TiO_xN_y$ or $ZrTiO_xN_y$ interlayers can be formed by co-doping of TiN and $TiO_2$ or $ZrO_2$. Titanium monoxide (TiO) and Zirconium monoxide (ZrO), which are isomorphisms of TiN, possess the same crystal structure as TiN but a rather smaller surface energy and lattice constant. Different to the common doping in FePt that leads to phase-separation, TiO and ZrO are soluble to TiN. Hence, if TiN and TiO or ZrO form a $TiO_xN_y$ or $ZrTiO_xN_y$ intermediate layer, according to Vegard's law, $TiO_xN_y$/$ZrTiO_xN_y$ may exhibit smaller surface energy than TiN so that island growth of FePt can be enhanced. Lattice mismatch with FePt may be less with $TiO_xN_y$ than with $ZrTiO_xN_y$. Properties such as surface energy and lattice constant of $TiO_xN_y$ or $ZrTiO_xN_y$ interlayers would be modulated when x/y are varied, which provides opportunity for achieving optimal FePt films with different doping materials.

For the application of TiN—X layer, a number of medium structures may be used, such as those shown in FIGS. 1a, 1b, 2a, and 2b. As shown in FIG. 1a, the TiN—X interlayer 110 underlies the magnetic recording layer 120 and is directly formed on silicon/glass substrate 101. An FePt based recording layer (e.g., having thickness of about 10 nm) grown on (001) oriented fcc TiN—X grain will possess perpendicular anisotropy due to epitaxial growth and small grain size due to the columnar structure of the TiN—X and/or other doping in FePt. The FePt material is doped with the non-magnetic segregant which segregates between the FePt grains. In order to reduce FePt grain size, one or more dopants may be used, such as C, Ag, $SiO_2$, $TiO_2$, $Ta_2O_5$ and/or $Si_3N_4$. In some cases, the TiN—X layer plays the role as heat sink layer as well.

FIG. 2a shows another medium structure, in which TiN—X (about 5-10 nm in thickness) underlies the magnetic recording layer 120. In this example, the TiN—X layer is formed on an underlayer, such as a CrRu or MgO-based underlayer. A function of TiN—X interlayer in this configuration may be to block interdiffusion between underlayer 205 and FePt magnetic layer 120 and/or to further refine the microstructure of FePt recording layer.

TiON and ZrTiON layers were fabricated on CrRu (30 nm)/glass substrates by co-sputtering of TiN and $TiO_2$/$ZrO_2$ targets, respectively, in an anoxic circumstance in an ultrahigh vacuum chamber at Ar pressure of 10 mTorr. To investigate the intrinsic behaviors of TiON and ZrTiON layers regarding FePt growth, a group of samples of 10 nm pure FePt film were grown on the TiON and ZrTiON layers with various TiO or $ZrO_x$ doping were deposited on CrRu (30 nm)/glass substrates by magnetron sputtering at a base pressure $3 \times 10^{-9}$ Torr.

Another three groups of samples with FePt (4 nm)-35 vol. % $SiO_x$-20 vol. % C films were fabricated on TiON and ZrTiON intermediate layers, respectively, to further study the effect of TiON/ZrTiON intermediate layer on FePt grain size reduction. The improved microstructural control by using TiN (3 nm)/TiON (ZrTiON) (2 nm) complex intermediate layer was also investigated. In situ substrate heating during sputtering was used. The substrate temperatures for CrRu, TiON and FePt were 280° C. and 480° C. respectively. The elemental composition and chemical state of TiON/ZrTiON intermediate layers was determined by X-ray photoelectron spectroscopy (XPS). Crystallographic structure and microstructure of all the samples were measured by X-ray diffraction (XRD), scanning electron microscopy (SEM) and transmission electron microscopy (TEM). Magnetic properties were characterized at room temperature by a superconducting quantum interference device (SQUID) with a maximum applied field of 5 Tesla.

Figure 3:
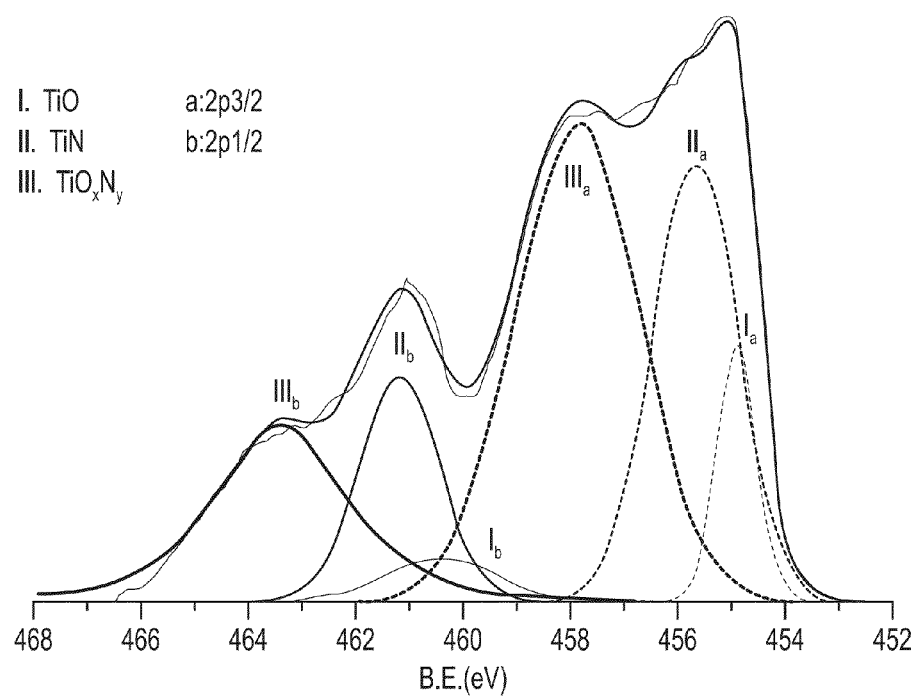
FIG. 3 shows high resolution XPS analysis of the Ti2p spectra for the TiON intermediate layer with 40 vol. % $TiO_x$ doping. I-monoxide, II-nitride and III-oxynitride.

The TiN and $TiO_2$ co-sputtering in this experiment was conducted in an ultrahigh vacuum chamber using Ar as working gas. It was expected that the final state of the oxygen in the deposited films would be in the form of Titanium monoxide rather than in the form of titanium dioxide due to a lack of oxygen during sputtering. Titanium nitride and titanium monoxide are isomorphous and completely soluble. They also have a wide range of composition. As a consequence, the resultant intermediate layer may be a solid solution of TiN and TiO, namely, TiON intermediate layer. FIG. 3 shows high resolution XPS analysis of the Ti2p spectra for the TiON intermediate layer with 40 vol. % $TiO_x$ doping. I-monoxide, II-nitride and III-oxynitride, appeared in Ti2p3/2 and Ti2p1/2 spin-orbital doublet peaks, indicating that titanium and oxygen formed into TiO rather than $TiO_2$. The quantitative analysis of Ti2p spectra showed that the resultant TiON intermediate layer from co-sputtered TiN-40 vol. % $TiO_x$ has a stoichiometry of $TiO_{0.45}N_{0.55}$ and X is TiO2, in which TiO concentration is quite close to the calibrated doping concentration of $TiO_x$. Moreover, depth profile analysis of TiON intermediate layer reveals a uniform elemental distribution of Ti, O and N, thus indicating that titanium monoxide may not originate from surface oxidation.

Figure 4A:
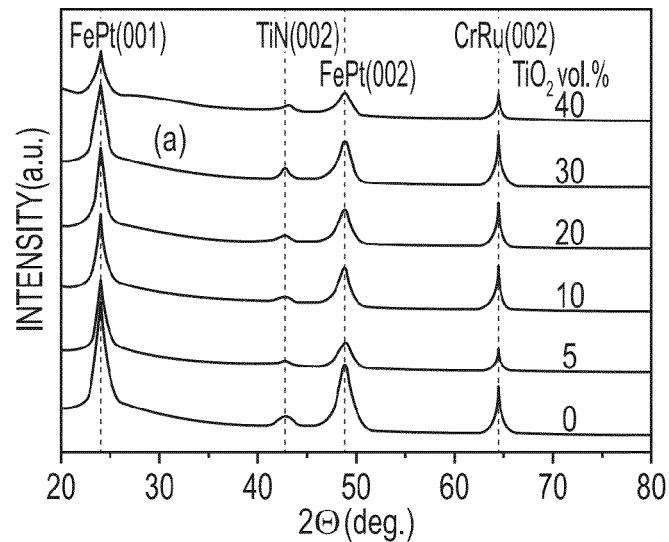
FIG. 4a shows XRD spectra of 10 FePt films grown on TiON intermediate layers with various $TiO_x$ doping concentrations.
Figure 4B:
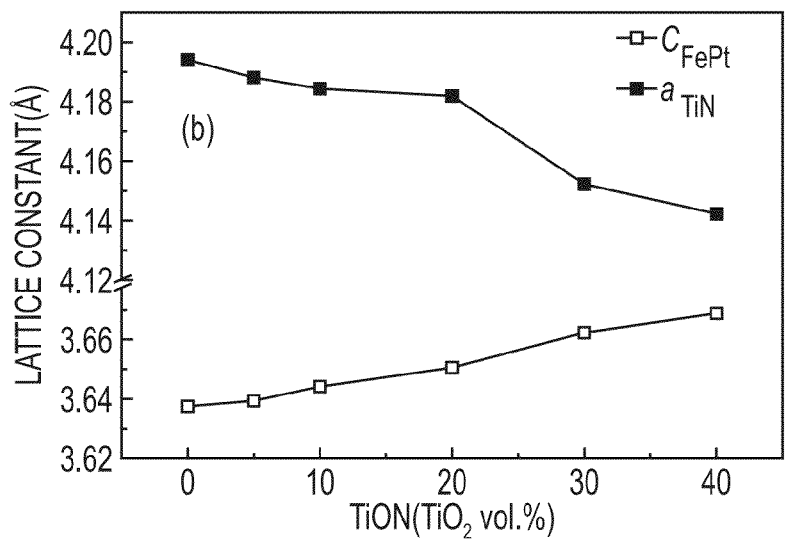
FIG. 4b shows the TiON lattice constant a and FePt lattice constant c with increasing $TiO_x$ doping.

The crystalline structure of all samples was determined by XRD measurement. FIG. 4a shows XRD spectra of 10 FePt films grown on TiON intermediate layers with various $TiO_x$ doping concentrations. All the FePt films grown on TiON intermediate layers exhibit good $L1_0$ (001) texture. Only TiON (002) peak is observed and no peaks from any other Ti—O—N phases are found, suggesting a single f.c.c lattice structure. Slight shifts of FePt (001) peaks towards lower angle and of TiON (002) peaks towards higher angle with increasing $TiO_x$ doping can be seen. As plotted in FIG. 4b a decrease in TiON lattice constant a and an increase in FePt lattice constant c with increasing $TiO_x$ doping are obtained according to the calculation based on XRD data. This may imply that FePt/TiON lattice misfit is decreased by introducing $TiO_x$ doping, thus favoring $L1_0$ (001) FePt epitaxial growth. With 40 vol. % $TiO_x$ doping, lattice constant of TiON was 4.141 Å, which was smaller than 4.242 Å of pure TiN, and lattice constant c of FePt was 3.669 Å. Greater than 40 vol. % $TiO_x$ doping is likely to cause deterioration of the interlayer and recording layer orientation. It is worth noting that both f.c.c TiN and f.c.c TiO can withstand a large number of vacancies in either Ti or N(O) lattice sites. In general, lattice constant decreases with increasing vacancies. Therefore, the existence of vacancies may be another contribution to the decrease of TiON lattice constant.

Figure 5A:
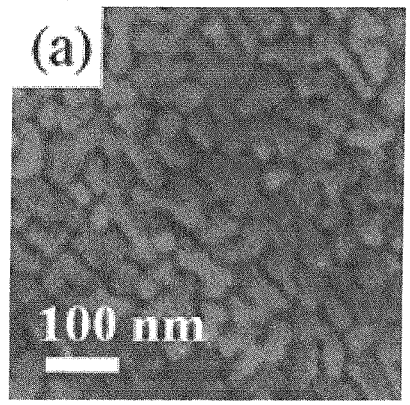
FIGS. 5a, 5b, and 5c illustrate SEM images of 10 nm FePt films grown on TiON intermediate layers with different $TiO_x$ doping concentrations.
Figure 5B:
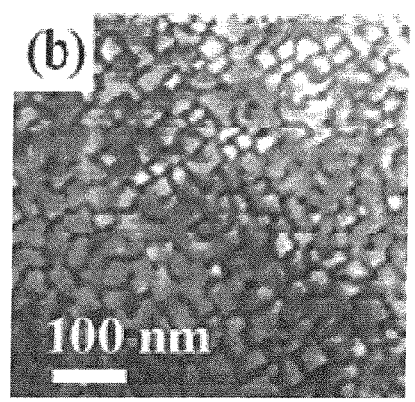
Figure 5C:
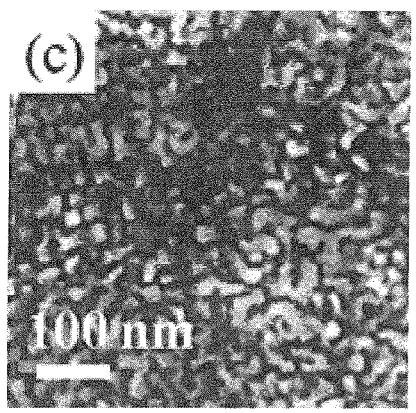

Planar view SEM images of the FePt films grown on TiON intermediate layer with various $TiO_x$ doping concentrations are shown in FIGS. 5a-5c. FIGS. 5a, 5b, and 5c illustrate SEM images of 10 nm FePt films grown on TiON intermediate layers with TiOx doping concentrations of 0 (5a), 20% (5b), and 40% (5c). In comparison with the FePt film grown on pure TiN intermediate layer, FePt grain size was reduced when FePt was grown on TiON intermediate layer. Furthermore, the grain size is reduced with increasing $TiO_x$ doping concentration. The grain isolation is improved as well. The oxides of titanium have smaller surface energy than its nitrides. As a result, the surface energy of TiON is reduced with increasing $TiO_x$ component allowing reduction of FePt grain size and the improvement of its grain isolation. This is consistent with Volmer-Weber type (island) growth techniques. Co-sputtering of TiN and $TiO_x$ may create more defects on the surface of the TiON layer, which could play the role as a nucleation site and contribute to the reduction of FePt grain size.

Figure 6:
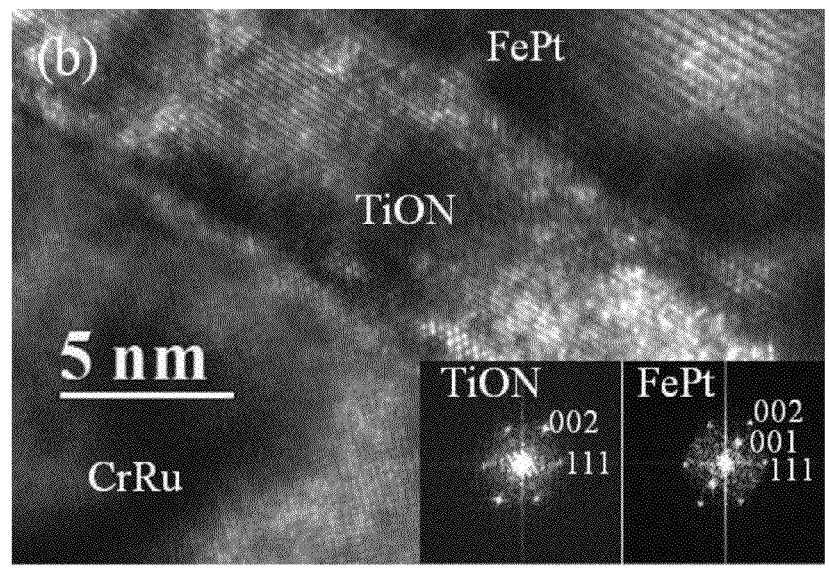
FIG. 6 shows a high resolution cross-sectional TEM image of the FePt film with TiN-40 vol. % $TiO_x$ intermediate layer.

FIG. 6 shows a high resolution cross-sectional TEM image of the FePt film with TiN-40 vol. % $TiO_x$ layer that forms a TiON layer. The TiON layer is continuous with good f.c.c crystallinity and a well-defined TiON/FePt interface. Although high concentration of $TiO_x$ was doped into TiN, no phase separation is observed in TiON intermediate layer. Therefore, the TiON intermediate layer is a solid solution of f.c.c TiN and f.c.c TiO, which is consistent with the XPS and XRD results discussed previously. The selected area electron diffraction (SAED) patterns of TiON and FePt in insets of FIG. 6 indicate a good epitaxial relationship of TiON (001)<200>//FePt (001)<100>.

Figure 7:
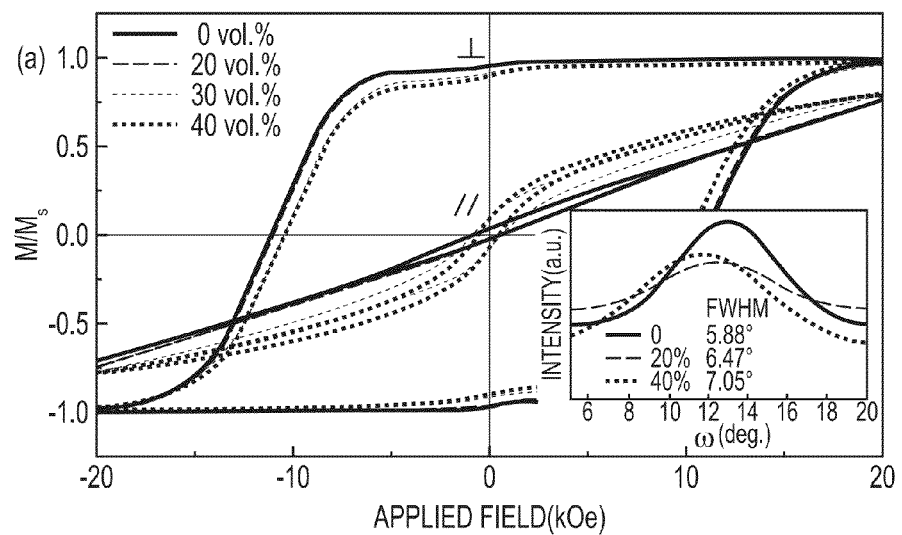
FIG. 7 shows the in-plane and out-of-plane M-H loops of 10 nm FePt films grown on 5 nm TiON intermediate layers with various $TiO_x$ doping concentrations.

FIG. 7 shows the in-plane and out-of-plane M-H loops of 10 nm FePt films grown on 5 nm TiON intermediate layers with various TiO doping concentrations. The inset diagram shows the rocking curves of FePt (001) peak for selected samples). FIG. 7 illustrates the slightly decreased squareness $(M_r/M_s)$ and coercivity, and no other obvious change. The M-H loops of the samples with different $TiO_x$ doping concentrations almost overlap. The slope change of in-plane M-H loops indicated a slightly increased in-plane easy axis component, which may be due to the widening of easy axis dispersion with increasing $TiO_x$ doping, as can be seen from the full width at half maximum (FWHM) of FePt (001) ω peak (inset of FIG. 7) with increasing $TiO_x$ doping. The unchanged in-plane loops with increasing $TiO_x$ doping indicates that, similar to TiN, the TiON intermediate layer can also prevent FePt film from large in-plane hysteresis, which differs from conventional MgO intermediate layer. The results here show that increasing addition of $TiO_x$ into TiN intermediate layer does not appear to deteriorate the magnetic properties of FePt in this example. FePt film growth is enhanced by the reduction of the surface energy and lattice mismatch with increasing $TiO_x$ doping. Increasing the addition of $TiO_x$ into the TiN—X intermediate layer did not significantly change the magnetic properties of FePt. From the planar view SEM images, average grain size of the FePt films was significantly reduced from 38.4 nm when growing on TiN intermediate layer to 20.2 nm when growing on TiON intermediate layer. The grain isolation improved as well. Because the oxides of titanium have smaller surface energy than its nitrides, as a result, the surface energy of TiON was reduced with increasing $TiO_x$ component. This is appropriate for Volmer-Weber type (island) growth of FePt, thus leading to the reduction of FePt grain size and the improvement of its grain isolation. Additionally, co-sputtering of TiN and $TiO_x$ may create more defects on the surface of TiON intermediate layer, which could play a role as nucleation sites and contribute to the reduction of FePt grain size. The effect of TiON intermediate layer on the microstructure of FePt will also be discussed later with doped FePt—$SiO_x$—C films.

Figure 8:
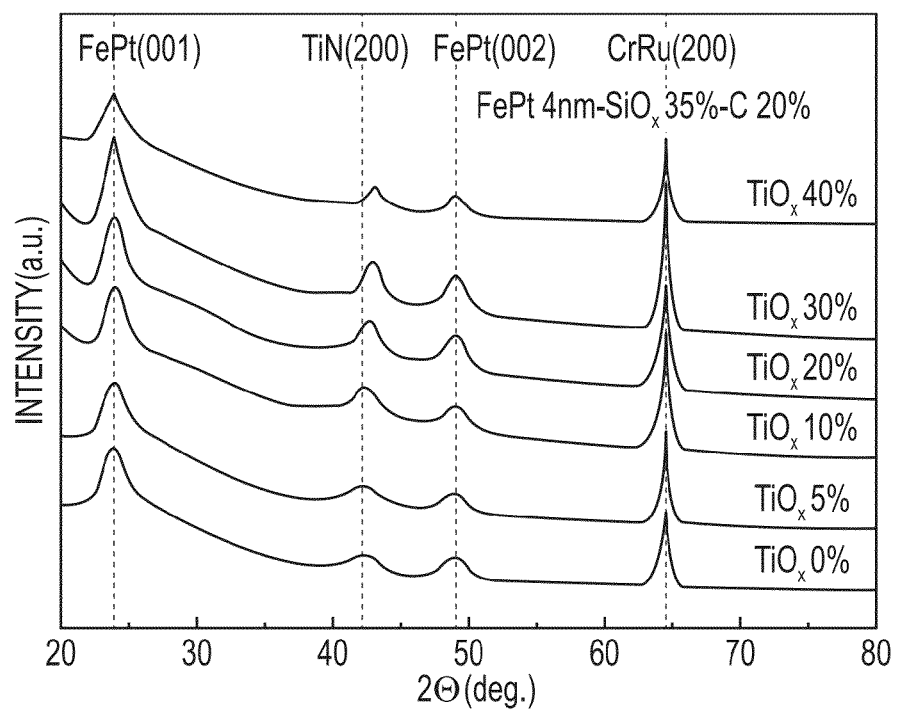
FIG. 8 shows a series of FePt (4 nm)-35 vol. % $SiO_x$-20 vol. % C films deposited on TiON intermediate layers with various $TiO_x$ doping concentrations.

According to the discussions above, TiON may be a good intermediate layer material for FePt in terms of epitaxial growth (decreased lattice mismatch) and island growth (reduced surface energy). Doping with non-magnetic segregant materials can be applied to FePt thin films which, among other features, tends to reduce the FePt grain size. FIG. 8 shows a series of FePt (4 nm)-35 vol. % $SiO_x$-20 vol. % C films deposited on TiON intermediate layers with various $TiO_x$ doping concentrations. Similarly to the XRD results of pure FePt films, as can be seen from FIG. 8, the FePt (4 nm)-35 vol. % $SiO_x$-20 vol. % C films exhibited good $L1_0$ (001) texture and slight (001) peak shift towards lower angle. The detailed investigation of the microstructure was implemented via TEM.

Figure 9A:
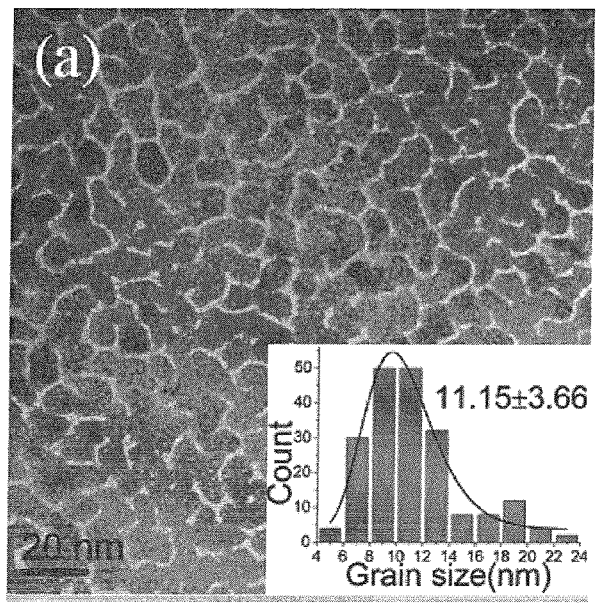
FIGS. 9a and 9d show planar-view TEM images that illustrate FePt grain size reduction, grain size uniformity and grain isolation was improved with increasing $TiO_x$ doping in $TiO_x$ intermediate layer.
Figure 9B:
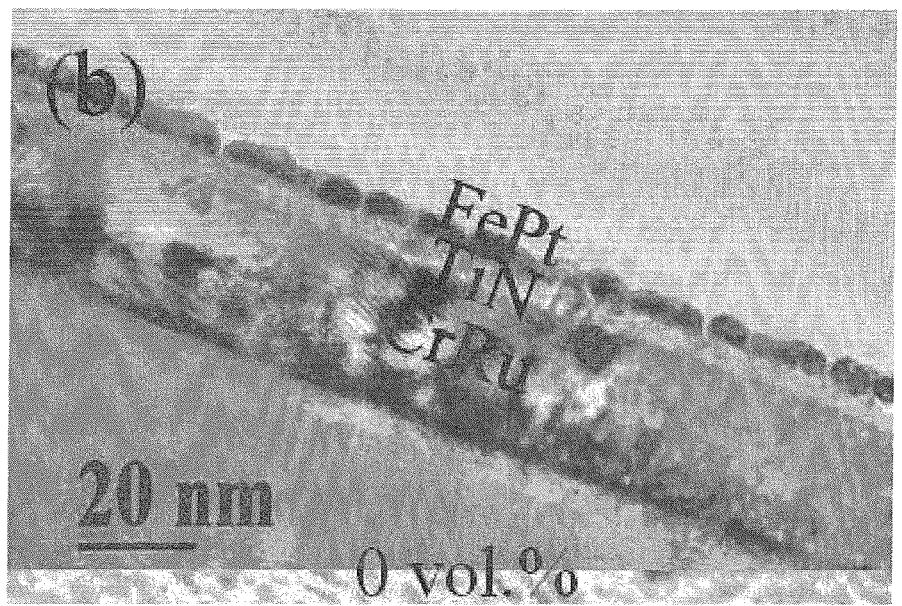
FIGS. 9b, 9c, 9e, and 9f show the cross-sectional TEM images of FIGS. 9a and 9d.
Figure 9C:
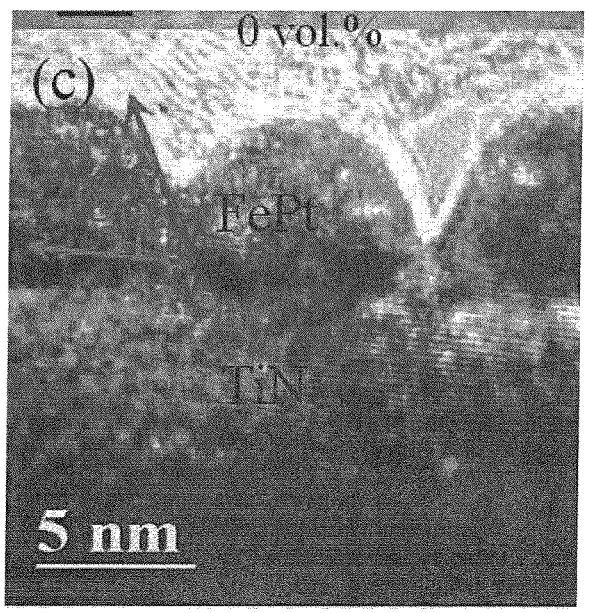
Figure 9D:
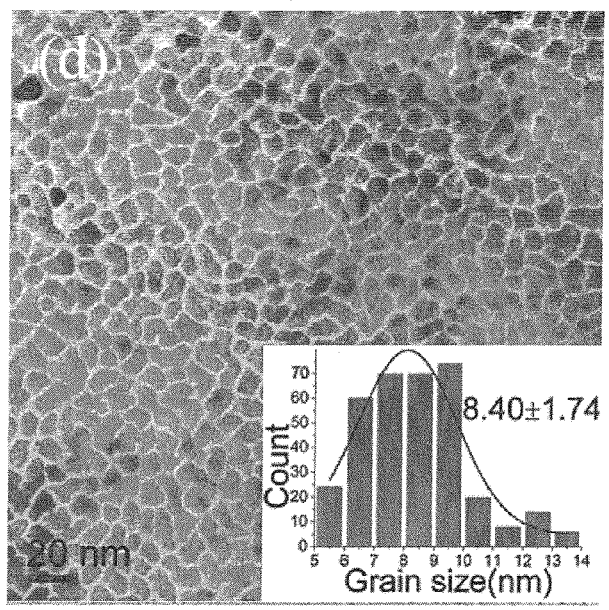
Figure 9E:
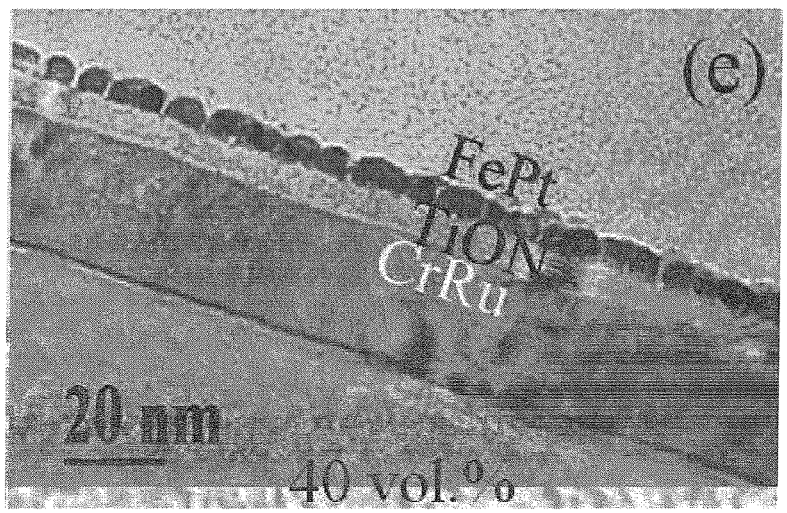
Figure 9F:
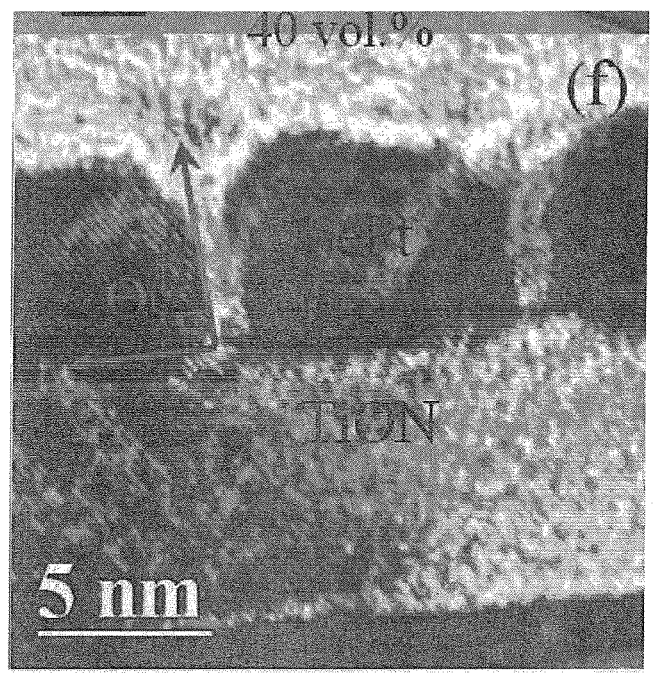

FIGS. 9a and 9d show planar-view TEM images that illustrate FePt grain size, grain size uniformity and grain isolation was enhanced with increasing $TiO_x$ doping in the $TiO_x$ intermediate layer. The doped FePt—$SiO_x$—C films show a greater grain size reduction than pure FePt. The average grain size of FePt (4 nm)-35 vol. % $SiO_x$-20 vol. % C film was decreased from 11.15±3.66 nm with a pure TiN intermediate layer to 8.40±1.74 nm with TiN—$TiO_x$ 40 vol. % intermediate layer. FIGS. 9b, 9c, 9e, and 9f show the cross-sectional TEM images of these two samples. FePt film grown on pure TiN intermediate layer exhibited semi-spherical grain shape due to the good wettability of TiN to FePt. The wetting angle was smaller than 90° as labeled in FIG. 9c. According to Young equation, this signifies that the TiN surface energy was larger than FePt/TiN interfacial energy. Although wetting is favorable to epitaxial growth, the tight contact between FePt and TiN caused diffusing out of doping materials, thus weakening the effectiveness of the further increased doping. Semi-spherical grain shape led to the interconnectedness of grains, thus jeopardizing the grain isolation. FIGS. 9e and 9f showed the case of a TiON intermediate layer comprising TiN with 40 vol. % $TiO_x$. Substantially uniform FePt grains with square cross-section shapes can be observed. The contact angle as labeled in FIG. 9f was 90°. According to Young equation, this contact angle signifies an equality of FePt/TiON interfacial energy and TiON surface energy. Therefore, the surface energy of TiON was smaller than that of TiN; hence the segregated island growth of FePt grains was improved. Furthermore, the square grains were well isolated, thus promoting the effectiveness of grain size reduction by doping. It is worth noting that the square FePt grains obtained by TiON intermediate layer have larger volume than semi-spherical grains obtained by TiN (wetting) or spherical grains obtained by MgO (non-wetting) under same thickness and same grain diameter; so square grains can afford much higher thermal stability than semi-spherical grains for the same grain center-to-center spacing. It can be advantageous to reduce the FePt grain size close to superparamagnetic limit.

The TiON (TiN doped by TiOx) intermediate layer was fabricated by co-sputtering of TiN and $TiO_2$ targets in an anoxic circumstance in an ultra-high vacuum chamber at Ar pressure of 10 mTorr. Two samples with FePt (4 nm)-35 vol. % SiOx-20 vol. % C films grown on TiN interlayers and TiN-40 vol. % TiOx interlayer were deposited on CrRu (30 nm)/glass substrates by magnetron sputtering at a base pressure 3×10-9 Torr, respectively. In situ substrate heating during sputtering was used. The substrate temperature for CrRu, TiON was 280° C. and the substrate temperature for FePt was 480° C. The elemental composition and chemical state of TiON intermediate layer were determined by X-ray photo-electron spectroscopy (XPS). Crystallographic structure and microstructure of all the samples were measured by X-ray diffraction (XRD), scanning electron microscopy (SEM) and transmission electron microscopy (TEM). Magnetic properties were characterized at room temperature by a superconducting quantum interference device (SQUID) with a maximum applied field of 5 Tesla.

Figure 10:
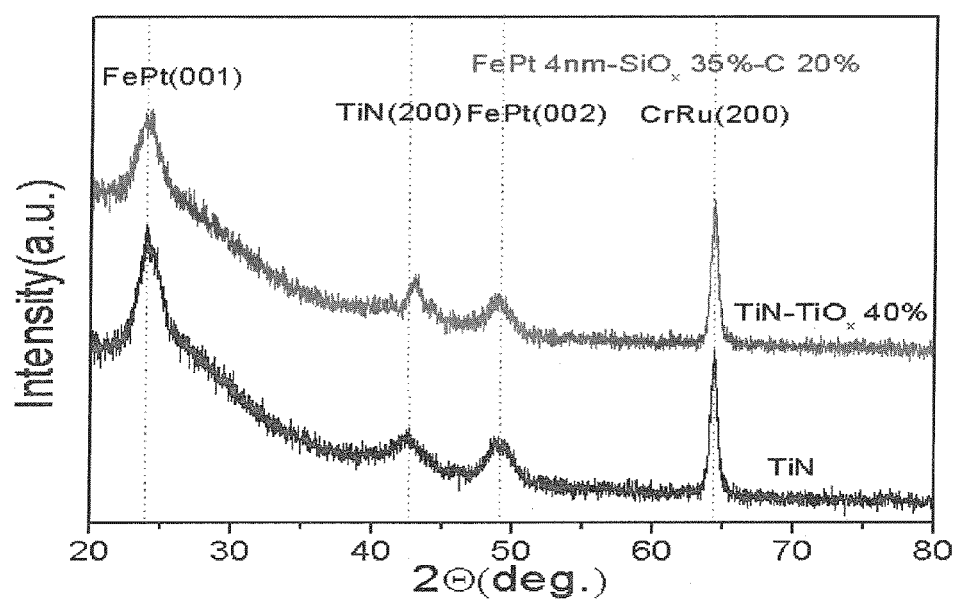
FIG. 10 illustrates XRD results.

The quantitative analysis of XPS Ti2p spectra showed that co-sputtered TiN-40 vol. % $TiO_x$ finally formed into $TiO_{0.45}N_{0.55}$. Moreover, the depth profile analysis of TiON intermediate layers revealed a substantially uniform elemental distribution of Ti, O and N, excluding the possibility of surface oxidation. From XRD results shown in FIG. 10, both FePt (4 nm)-35 vol. % $SiO_x$-20 vol. % C films on TiN and TiN-40 vol. % $TiO_x$ exhibited good $L1_0$ (001) texture. But the one with TiN-40 vol. % $TiO_x$ interlayer showed slight (001) peak shift towards lower angle, indicating a reduced lattice constant and hence reduced TiN—X/FePt (001) lattice mismatch.

FePt grain size reduction, grain size uniformity and grain isolation was improved with TiOx doping in TiN—X interlayer. The doped FePt—SiOx-C films showed a significant grain size reduction. The average grain size of FePt (4 nm)-35 vol. % SiOx-20 vol. % C film was decreased from 11.15±3.66 nm with pure TiN intermediate layer to 5.65±0.92 nm with TiN—TiOx 40 vol. % interlayer.

Moreover, FePt film grown on pure TiN intermediate layer exhibited semi-spherical grain shape due to the good wettability of TiN to FePt. The wetting angle was smaller than 90°. Interestingly, uniform FePt grains with square cross-section shapes were observed in the case of FePt films on TiN—TiOx-40 vol. % interlayer. The contact angle was 90°. According to Young equation, it signified an equality of FePt/TiON interfacial energy and TiON surface energy. Therefore, the surface energy of TiON was smaller than that of TiN, hence the island growth of FePt was improved. Furthermore, the square grains were well isolated, thus promoting the effectiveness of grain size reduction by doping. It is worth noting that the square FePt grains obtained by TiON interlayer have larger volume than semi-spherical grains obtained by TiN (wetting) or spherical grains obtained by MgO (non-wetting) under same thickness and same grain diameter; so square grains can afford much higher thermal stability than semi-spherical grains. This will be essentially important when the FePt grain size was reduced close to superparamagnetic limit.

Figure 11A:
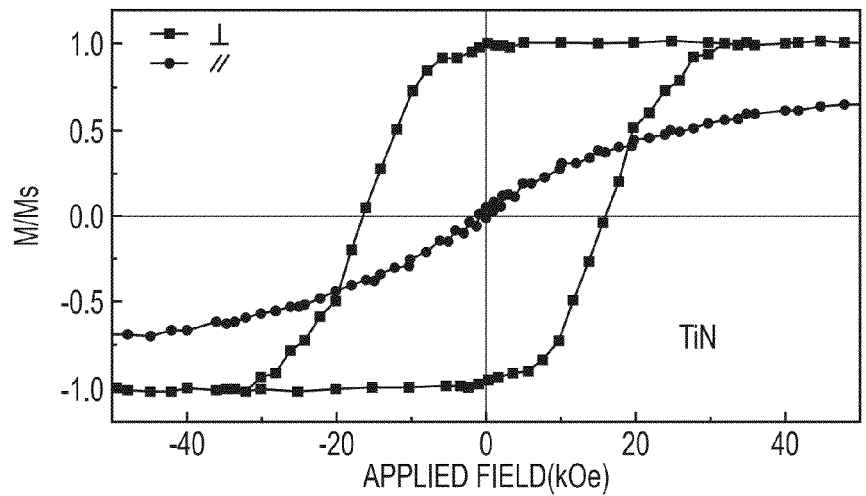
FIGS. 11a and 11b show similarity of features of two samples.
Figure 11B:
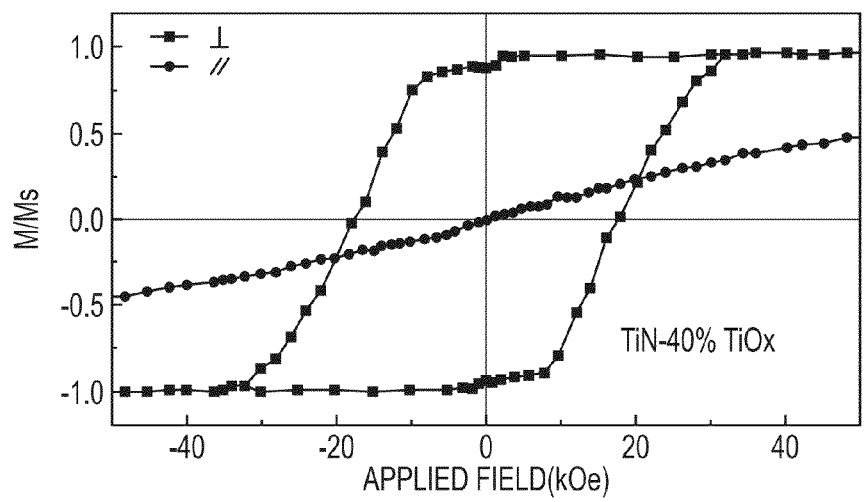

Both the loops of these two samples showed quite similar features with a high coercivity of 17 kOe as shown in FIGS. 11a and 11b. The squareness was slightly increased with introducing TiOx doping, which may be attributed to the increasing grain size uniformity and hence the decrease of the small grains with smaller magnetization saturation. No other obvious difference can be seen, suggesting that the doping in TiN—X interlayer will not deteriorate the magnetic properties of FePt.

Figure 12:
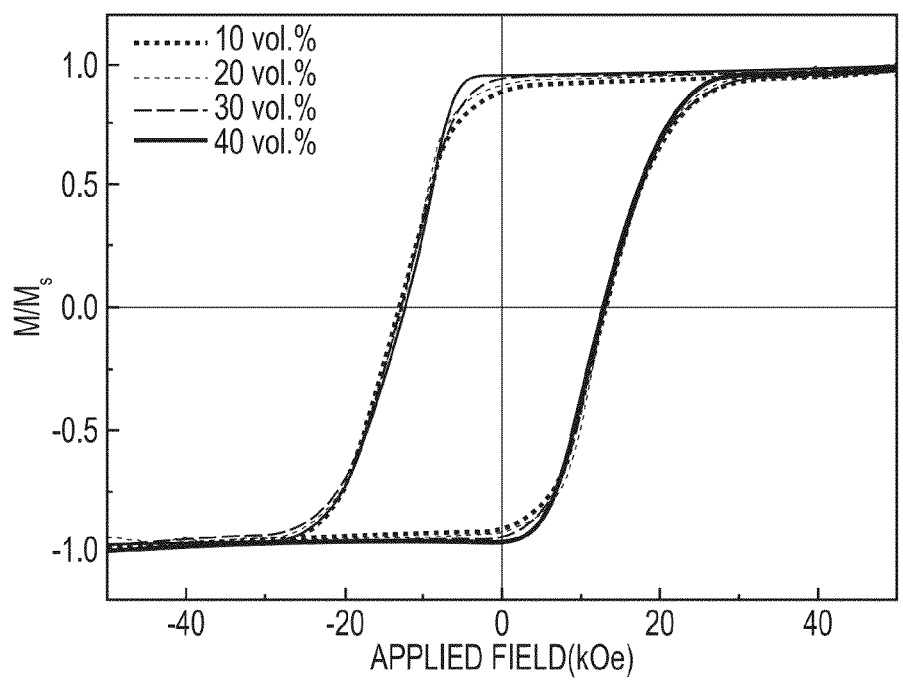
FIG. 12 illustrates that the out-the-plane M-H loops of FePt—$SiO_x$—C films grown on TiON intermediate layers with different $TiO_x$ doping show similar features with a high coercivity of 13 kOe.

As shown in FIG. 12, all of the out-the-plane M-H loops of FePt—SiO$_x$—C films grown on TiON intermediate layers with different TiO$_x$ doping showed quite similar features with a high coercivity of 13 kOe. The squareness was slightly increased with increasing TiO$_x$ doping concentration, which may be attributed to the increasing grain size uniformity and hence the decrease of the small grains with smaller magnetization saturation.

The TiON layer formed by co-doping of TiN and TiO$_x$ may have lower crystallinity than pure TiN, thus deteriorating the c-axis alignment. A complex TiN (3 nm)/TiON (40%, 2 nm) intermediate layer was also investigated. The microstructure and magnetic properties of FePt (4 nm)-35 vol. % SiO$_x$-20 vol. % C films grown on different intermediate layers were compared, as listed in Table 1. Table 1 shows The summary of full width at half maximum (FWHM) $\Delta\Theta_{50}$, out-of-plane coercivity H$_{c\perp}$, in-plane coercivity H$_{c//}$, squareness S, average grain size D, grain size distribution by standard deviation σ(D), and slope at coercivity α of FePt (4 nm)-35 vol. % SiO$_x$-20 vol. % C films grown on different intermediate layers. The c-axis dispersion was increased from 6.50° to 6.84° by using TiON intermediate layer but was reduced to 6.03° by using TiN/TiON interlayer. Accordingly, H$_{c\perp}$ was significantly decreased and H$_{c//}$ was increased when using TiON interlayer caused by the deterioration of c-axis orientation. After introducing TiN/TiON interlayer, much higher H$_{c\perp}$ and good perpendicular anisotropy was obtained. The slope at coercivity, i.e., $\alpha = 4\pi dM/dH|_{Hc} \approx 1$ indicates the exchange decoupling of the magnetic grains. From Table 1, we can see that for the cases with TiN and TiN/TiON interlayers, FePt films were nearly fully exchange-decoupled. However, in the case of TiON interlayer, exchange coupling slightly increased due to the decreased grain distance as shown in FIG. 9f. The grain size was further reduced and grain size uniformity was further improved when inserting a TiN layer under TiON intermediate layer.

TABLE 1

|  | $\Delta\Theta_{50}$ (°) | H$_{c\perp}$(kOe) | H$_{c//}$(kOe) | S | D (nm) | σ(D) (nm) | α |
|---|---|---|---|---|---|---|---|
| TiN (5 nm) | 6.50 | 16.39 | 0.77 | 0.99 | 11.15 | 3.66 | 1.06 |
| TION (5 nm) | 6.84 | 12.59 | 1.48 | 0.96 | 8.40 | 1.74 | 1.34 |
| TiN (3 nm)/ TiON (2 nm) | 6.03 | 17.52 | 0.26 | 0.97 | 7.71 | 1.16 | 1.08 |

The determination of the growth mechanism of thin films involves the competition of surface energy contribution and misfit strain contribution. Based on the previous discussions, FePt island can benefit from the reduction of both surface energy and lattice constant of TiON intermediate layer. Since the variation of the properties of TiON, such as lattice constant and surface energy, can be treated as a continuous linear change when varying the concentration ratio of TiN:TiO$_x$, the TiN—X intermediate layer (which forms TiO$_x$N$_y$ when TiN is doped with TiO$_2$) provides significant room for adjustment under different experimental conditions.

Figure 13A:
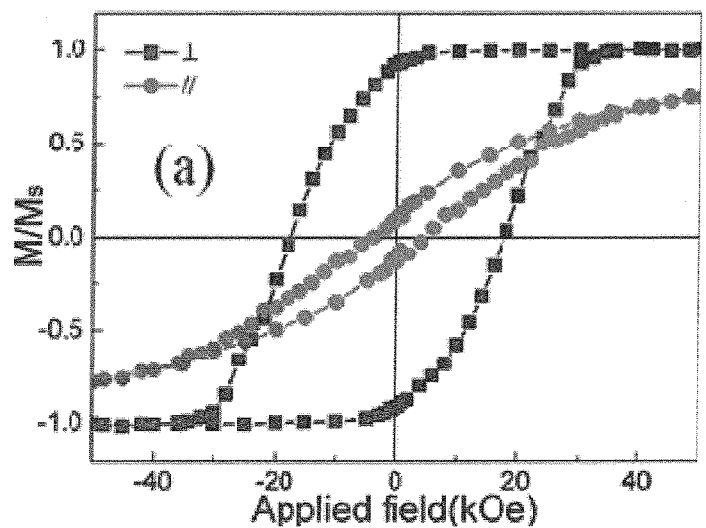
FIG. 13a shows in plane and out of plane M-H loops.
Figure 13B:
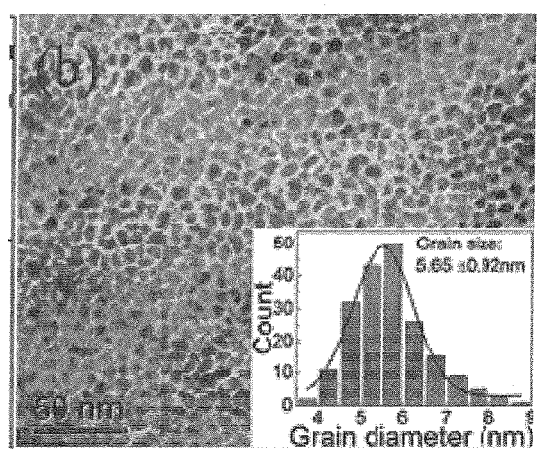
FIG. 13b illustrates planar-view TEM images of FePt (4 nm)-45 vol. % $SiO_x$-25 vol. % C films grown on TiON intermediate layers with 40 vol. % $TiO_x$ doping.
Figure 13C:
FIG. 13c shows cross-sectional TEM images of a sample.

FIG. 13a shows in plane and out of plane M-H loops, FIG. 13b illustrates planar-view TEM images, and FIG. 13c shows cross-sectional TEM images of a sample with structure FePt (4 nm)-45 vol. % SiO$_x$-25 vol. % C/TiN (2 nm)-TiO$_x$ 40 vol. %/TiN (3 nm)-CrRu (36 nm)/glass. Well isolated FePt grains with an average size as small as 5.65 nm were achieved. The grain size distribution was down to ±0.92 nm. Additionally, the sample exhibited good perpendicular magnetic anisotropy with an out-of-plane coercivity of 18 kOe.

Figure 14A:
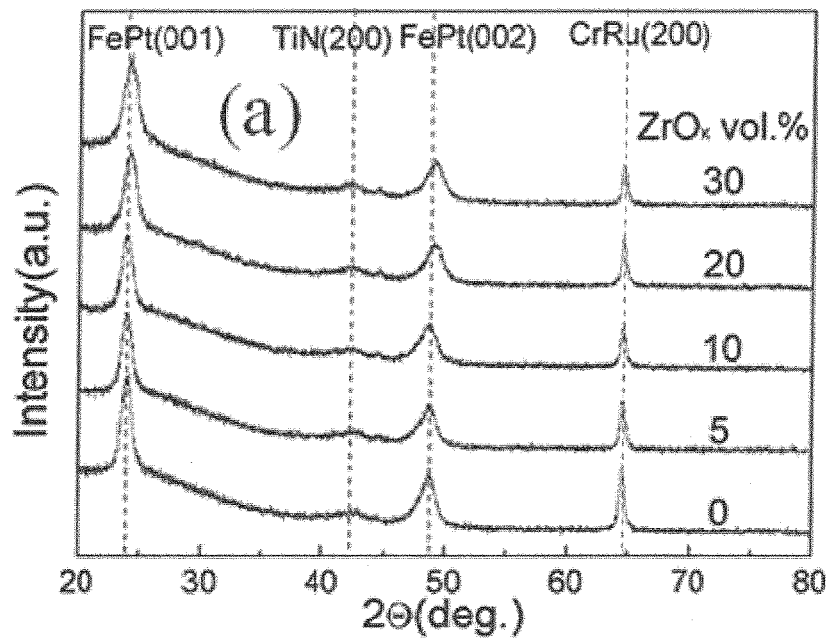
FIG. 14a illustrates XRD spectra of 10 nm FePt films grown on ZrTiON intermediate layers with various $ZrO_x$ doping concentrations.
Figure 14B:
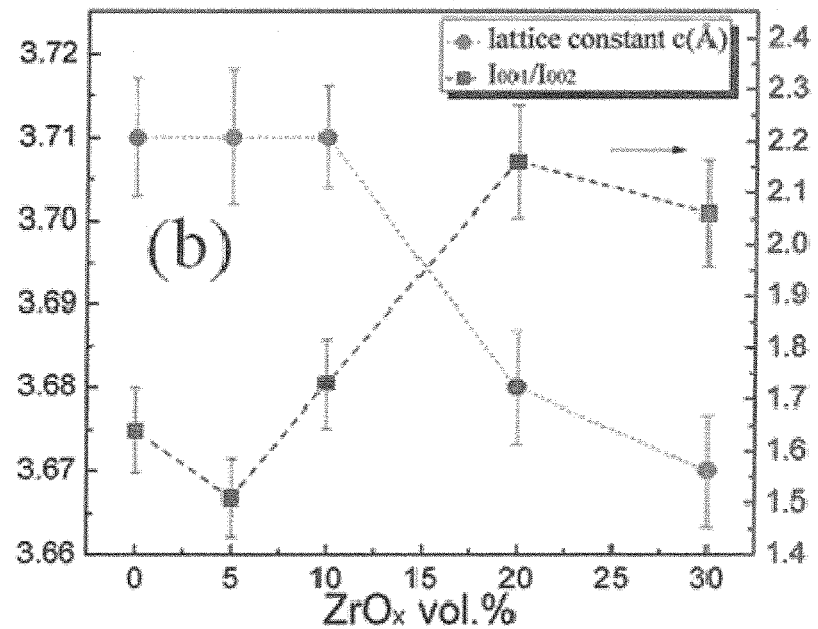
FIG. 14b illustrates the chemical ordering estimated by integrated peak intensity ratio-$I_{001}/I_{002}$ and the FePt lattice constant c extrapolated from XRD.

Some embodiments involve TiN—X layers doped with ZrO$_x$. Turning now to FIG. 14a, XRD spectra of 10 nm FePt films grown on ZrTiON intermediate layers with various ZrO$_x$ doping concentrations is shown. The FePt films showed good L1$_0$ (001) texture. The FePt (001) and TiN (002) peak intensities remained almost unchanged with higher doping level. FePt (001) and (002) peaks shifted towards a higher angle. These phenomena indicate that the doping of ZrO$_x$ in TiN does not deteriorate the epitaxial growth of FePt and the F.C.C structure of TiN, but the lattice constant of TiN may be increased which may cause an increase of the mismatch strain. The full width at half maximum (FWHM) of FePt (001) peak became broader with increasing ZrO$_x$ doping, suggesting that the FePt grain size may be reduced. FIG. 14b illustrates the chemical ordering estimated by integrated peak intensity ratio-I$_{001}$/I$_{002}$ and the FePt lattice constant c extrapolated from XRD. With increasing ZrO$_x$ concentration, the lattice constant c of FePt was reduced due to the increased mismatch while the chemical ordering was increased. The enhancement of the chemical ordering may be a result of the increased mismatch strain.

Figure 15A:
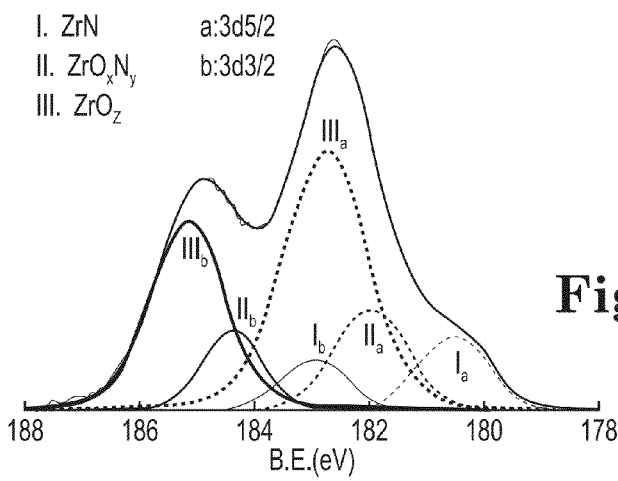
FIGS. 15a, 15b, and 15c show high resolution XPS analysis of the Zr3d, Ti2p and N1s spectra, respectively, for the ZrTiON intermediate layer with 30 vol. % $ZrO_x$ doping.
Figure 15B:
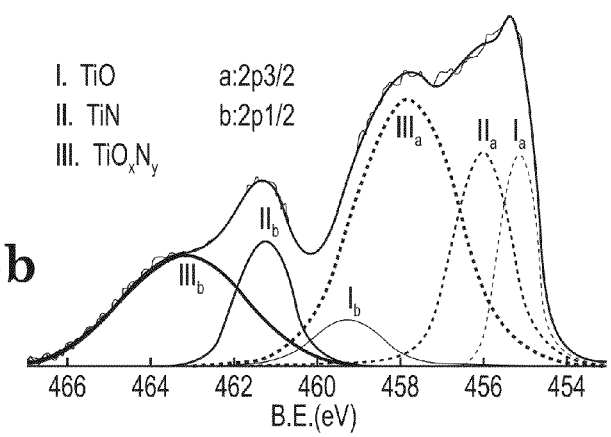
Figure 15C:
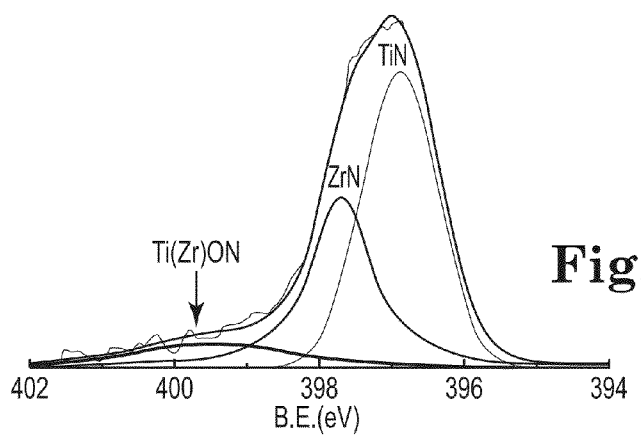

FIGS. 15a, 15b, and 15c show high resolution XPS analysis of the Zr3d, Ti2p and N1s spectra, respectively, for the ZrTiON intermediate layer with 30 vol. % ZrO$_x$ doping. As can be observed, similar to TiON, the ZrTiON layer comprised three chemical compositions: ZrN, ZrO$_x$N$_y$, and ZrO$_2$.

The qualitative analysis of XPS Ti2p spectra showed that co-sputtered TiN-30 vol. % ZrO$_x$ comprised mainly the solid solution of TiO, TiN, TiON, ZrN and ZrON. This was consistent with XRD results. A little ZrO$_2$ content was also found in TiN—ZrO$_x$ intermediate layer. The stoichiometry of ZrTiON intermediate layers with 20 vol. % and 30 vol. % ZrO$_x$ doping are summarized in Table 2. It should be noted that the ZrO$_2$ content increased significantly when ZrO$_x$ doping was increased from 20 vol. % to 30 vol. %, which means that the further increased ZrO$_x$ did not transformed ZrON solid solution but formed amorphous ZrO$_2$. The location of the ZrO$_2$, either remaining in grain boundaries or diffusing to surface, can be confirmed by TEM measurement.

TABLE 2

| Chemical compositions (at. %) of ZrTiON intermediate layer by XPS analysis | | | |
|---|---|---|---|
| ZrO$_x$ vol. % | ZrN | ZrON | ZrO$_2$ |
| 20 | 9.3% | 49.0% | 41.7% |
| 30 | 14.4% | 20.8% | 64.8% |

Planar view TEM images of the TiN—ZrO$_x$ 30 vol. % without a 10 nm FePt magnetic layer is shown in FIG. 16a. Planar view TEM images of the TiN—ZrO$_x$ 30 vol. % with a 10 nm FePt magnetic layer is shown in FIG. 16b. Both of the examples in FIGS. 16a and 16b exhibited small grains with an average grain size of around 6 nm. The well isolated ZrTiON grains suggested that the amorphous $ZrO_2$ content (64.8 at. % as shown in Table 2) remaining in grain boundaries may be more likely than diffusing out to surface. As shown in FIG. 16c the grain size distribution of pure FePt film grown on TiN-30 vol. % $ZrO_x$ intermediate layer was highly consistent with that of ZrTiON intermediate layer. This similarity may imply that the FePt grains were formed on top of the ZrTiON grains in the way of columnar growth. However, due to the fine grain boundaries of pure FePt film, it may be difficult to distinguish isolated FePt grains from the FePt layer in cross-sectional TEM images. Therefore, the columnar growth of ZrTiON (30 vol. %) observation by TEM will be discussed later with well isolated FePt—$SiO_x$—C films.

FIG. 17a-17d show high resolution TEM images of CrRu (30 nm)/TiN (5 nm)-$ZrO_x$ 40 vol. %/FePt (10 nm) film observed from zone axis <110> (FIG. 17a) and <010> (FIG. 17c), as indicated by the inset diffraction patterns. FIG. 17b is the corresponding inverse fast fourier transform (iFFT) image for FIG. 17a and FIG. 17d is the corresponding inverse fast fourier transform (iFFT) image for FIG. 17c.

The epitaxial relationship ZrTiON (002)<200>//FePt (001)<100> could be confirmed. From the iFFT images, the lattice distortion (FIG. 17b) and dislocations (FIG. 17d) can be seen. Moreover, the misfit dislocations were found at ZrTiON/FePt interfaces. It is known that the interfacial dislocations can reduce mismatch strain and improve epitaxial growth.

Figure 18:
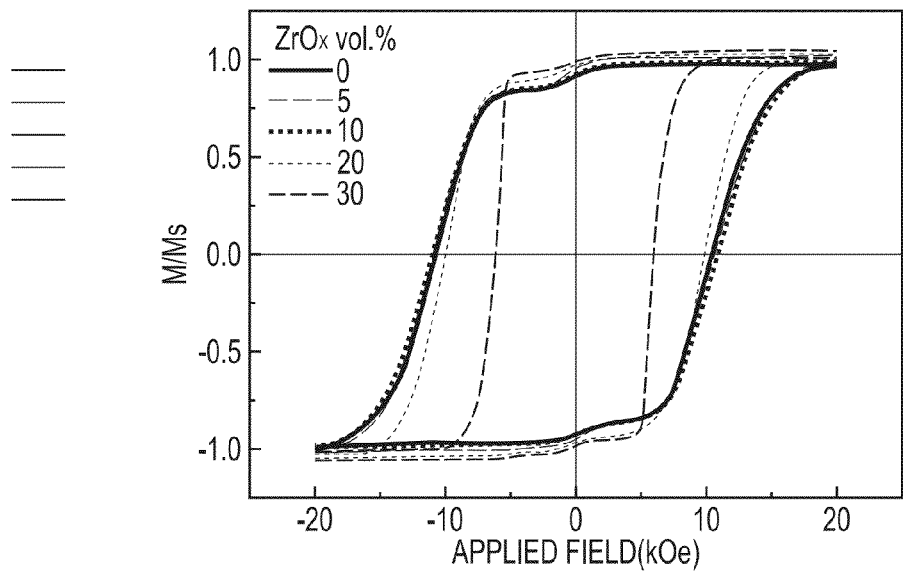
FIG. 18 illustrates out-of-plane M-H loops of 10 nm FePt films grown on ZrTiON intermediate layers with various ZrOx doping concentrations.
Figure 19:
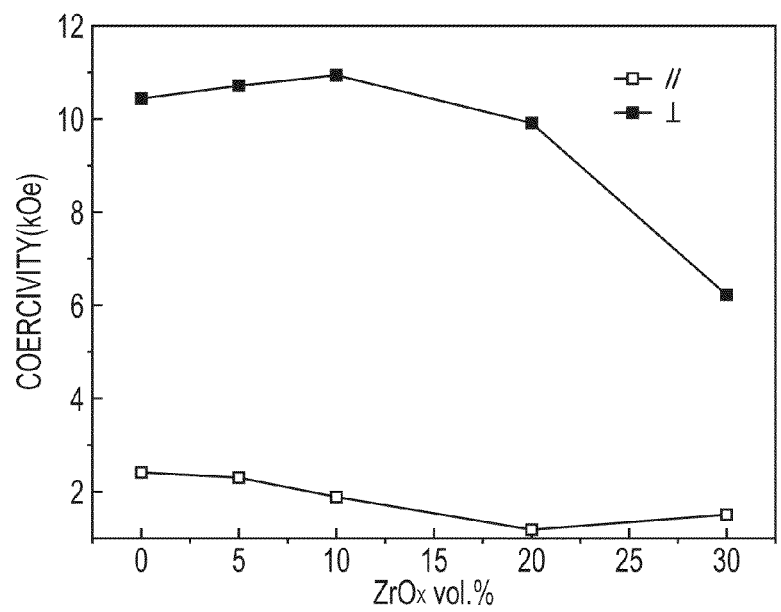
FIG. 19 shows the in-plane and out-of-plane coercivities.

FIG. 18 illustrates out-of-plane M-H loops of 10 nm FePt films grown on ZrTiON intermediate layers with various ZrOx doping concentrations. The out-of-plane M-H loops are shown in FIG. 18 and the respective in-plane and out-of-plane coercivities are summarized in FIG. 19. The out-of-plane coercivity increased from 0 to 10% and then decreased while the in-plane coercivity roughly kept decreasing with increasing $ZrO_x$ doping concentration. The decrease in out-of-plane coercivity may be due to the increased soft magnetic phase, as indicated by the kink that can be seen in FIG. 18.

Figure 20:
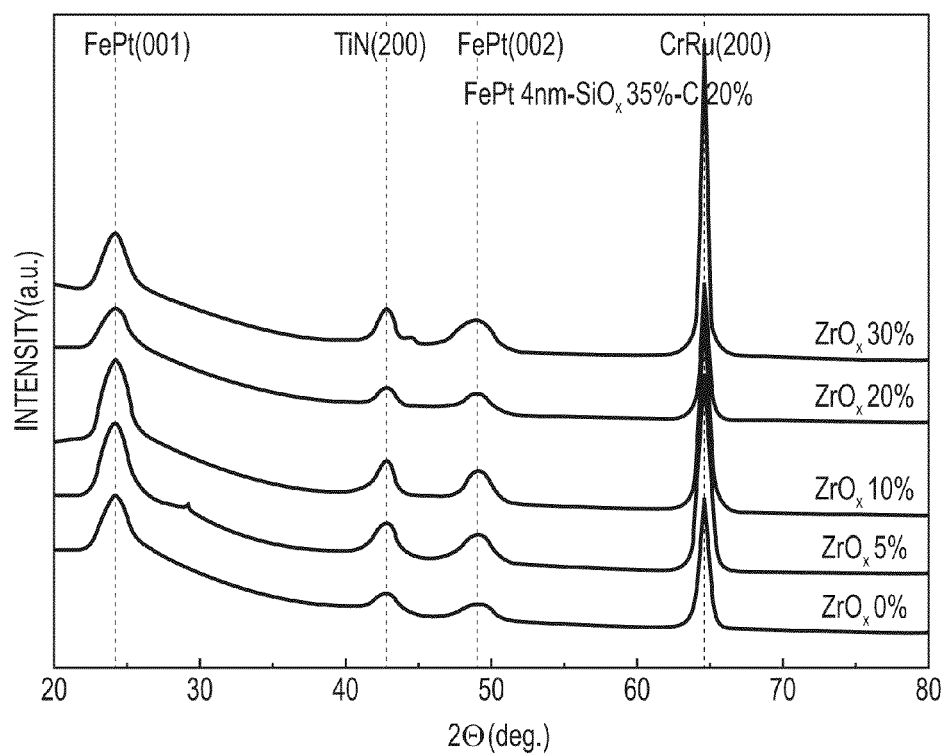
FIG. 20 illustrates XRD spectra of FePt (4 nm)-$SiO_x$ 35 vol. %-C 20 vol. % films grown on ZrTiON intermediate layers with various $ZrO_x$ doping concentrations.
Figure 21A:
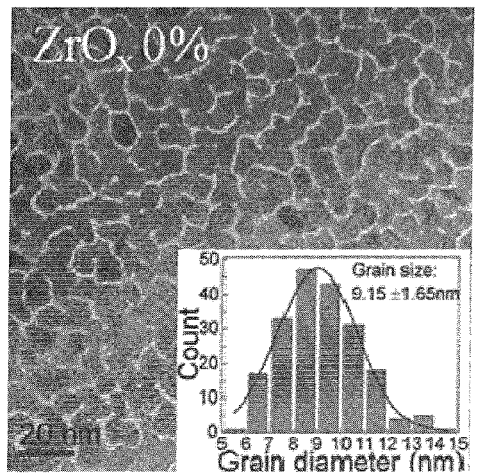
FIGS. 21a, 21b, 21c, and 21d show the planar view SEM images and the corresponding statistical grain size distribution of FePt (4 nm)-$SiO_x$ 35 vol. %-C 20 vol. % films grown on ZrTiON intermediate layers with various $ZrO_x$ doping concentrations.
Figure 21B:
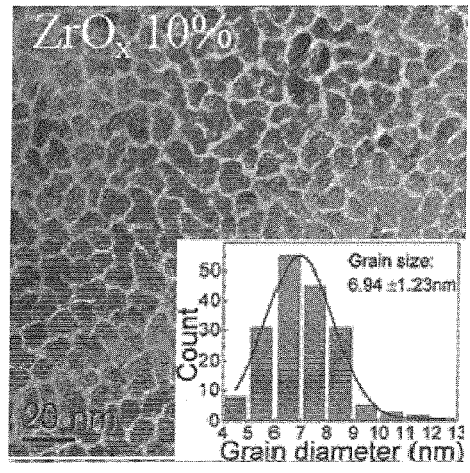
Figure 21C:
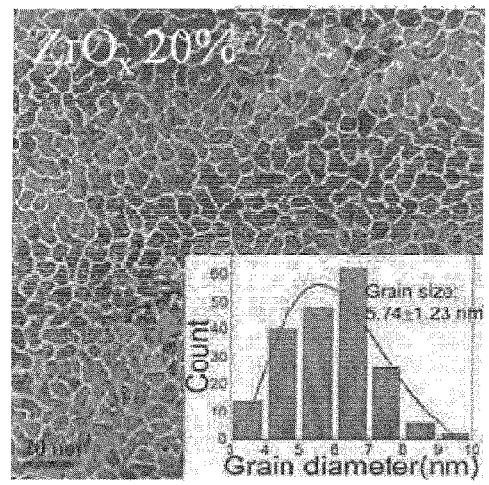
Figure 21D:
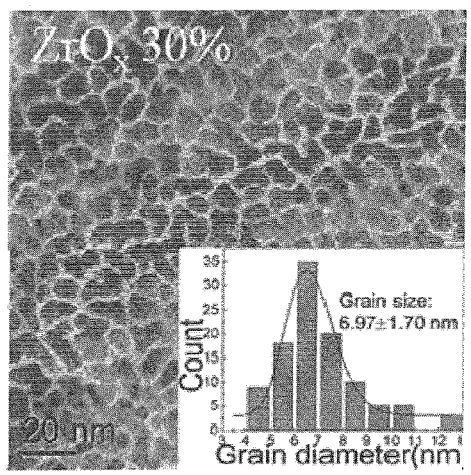

Some embodiments involve two phase segregated granular FePt grown on a TiN—X intermediate layer, where X is $ZrO_2$. TiN—ZrOx intermediate layers were fabricated by co-sputtering of TiN and $ZrO_2$ targets in an anoxic circumstance in an ultra-high vacuum chamber at Ar pressure of 10 mTorr. a sample with FePt (4 nm)-35 vol. % SiOx-20 vol. % C film grown on TiN-30 vol. % $ZrO_x$ interlayer, where x is 2, for example, were deposited on CrRu (30 nm)/glass substrates by magnetron sputtering at a base pressure 3×10-9 Torr. The reference sample with pure TiN interlayer in example 1 was also set as the reference sample here. In situ substrate heating during sputtering was used. The substrate temperature for CrRu, TiN—$ZrO_x$ was 280° C. the substrate temperature for FePt was 480° C. Turning now to FIG. 20, XRD spectra of FePt (4 nm)-$SiO_x$ 35 vol. %-C 20 vol. % films grown on TiN—$ZrO_2$ intermediate layers (which form ZrTiON intermediate layers) with various $ZrO_x$ doping concentrations are shown. As seen from FIG. 20, the XRD results of FePt—$SiO_x$—C films grown on ZrTiON intermediate layer exhibited good $L1_0$ (001) texture and no peak shift was found. The relative intensity of FePt (001) peak did not show obvious change, suggesting that the epitaxial growth of FePt—$SiO_x$—C granular films could be well maintained with increasing $ZrO_x$ doping in TiN intermediate layer.

The planar view SEM images and the corresponding statistical grain size distribution of FePt (4 nm)-$SiO_x$ 35 vol. %-C 20 vol. % films grown on ZrTiON intermediate layers with various $ZrO_x$ doping concentrations are shown in FIGS. 21a, 21b, 21c, and 21d. Average grain size and its standard deviation decreased with increasing $ZrO_x$ concentration from 0 to 20 vol. %. The grain isolation also improved. At 20 vol. %, as in FIG. 21c grain size was 5.74±1.23 nm. The grain size reduction could result from the reduced surface energy of the ZrTiON intermediate layer, which favored the island growth. However, a further increase of $ZrO_x$ concentration to 30 vol. %, as in FIG. 21d caused the increase of the grain size and the deterioration of the grain size uniformity. The wide spread $ZrO_x$ may block part of the nucleation sites on ZrTiON surface, finally leading to the increase of FePt grain size.

Figure 22:
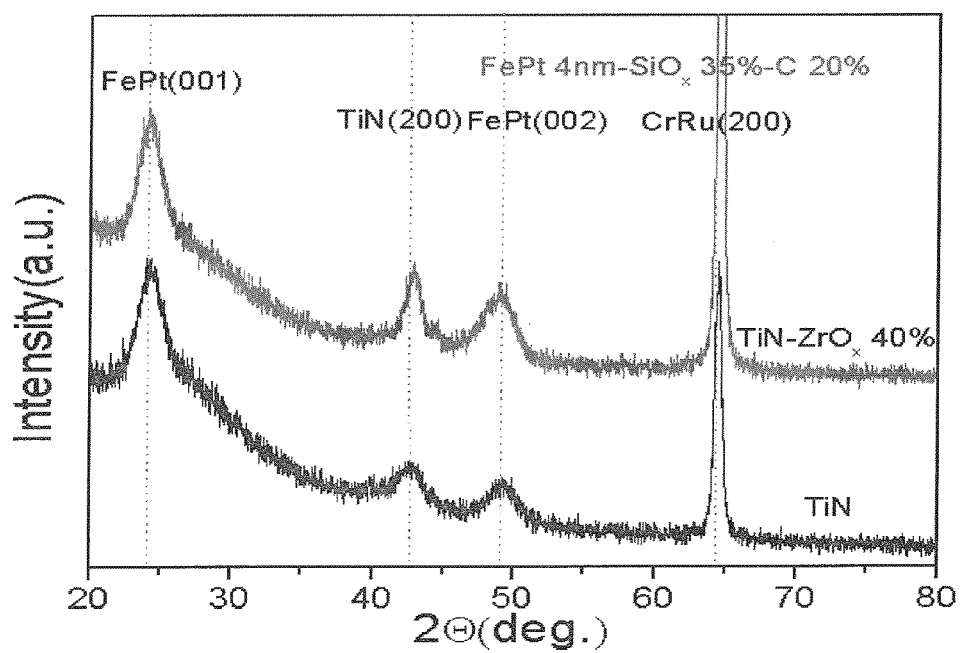
FIG. 22 shows XRD spectra of FePt 4 nm-SiOx 35%-C 20% films on TiN and TiN-30 vol. % $ZrO_x$ interlayers.

FIG. 22 shows XRD spectra of FePt 4 nm-SiOx 35%-C 20% films on TiN and TiN-30 vol. % $ZrO_x$ interlayers. From XRD results in FIG. 22, both FePt (4 nm)-35 vol. % $SiO_x$-20 vol. % C films on TiN and TiN-40 vol. % $ZrO_x$ exhibited good L10 (001) texture. Only fcc (002) peak for TiN-40 vol. % $ZrO_x$ was observed. Negligible peak shift was found after introducing ZrOx doping in TiN interlayer.

Figure 23A:
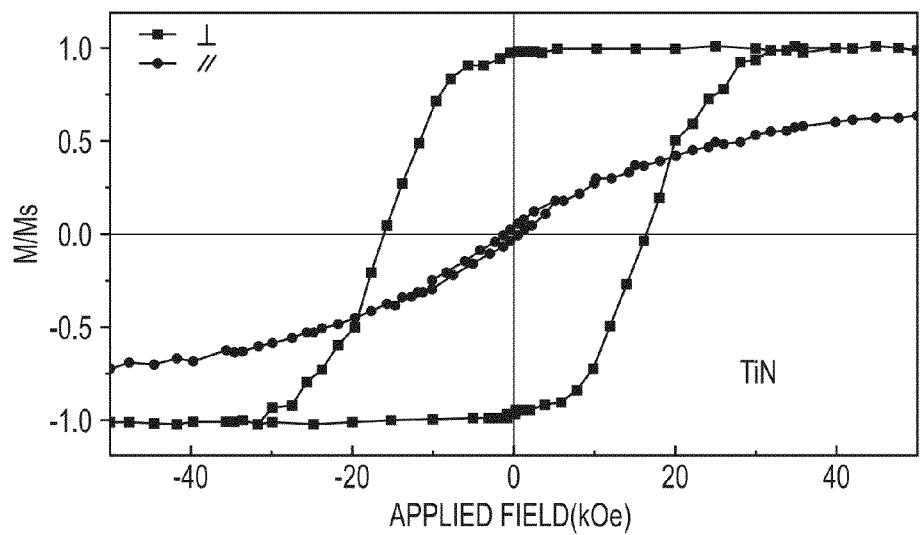
FIGS. 23a and 23b show M-H loops of FePt 4 nm-SiOx 35%-C 20% films on TiN and TiN-30 vol. % $ZrO_x$ interlayers.
Figure 23B:
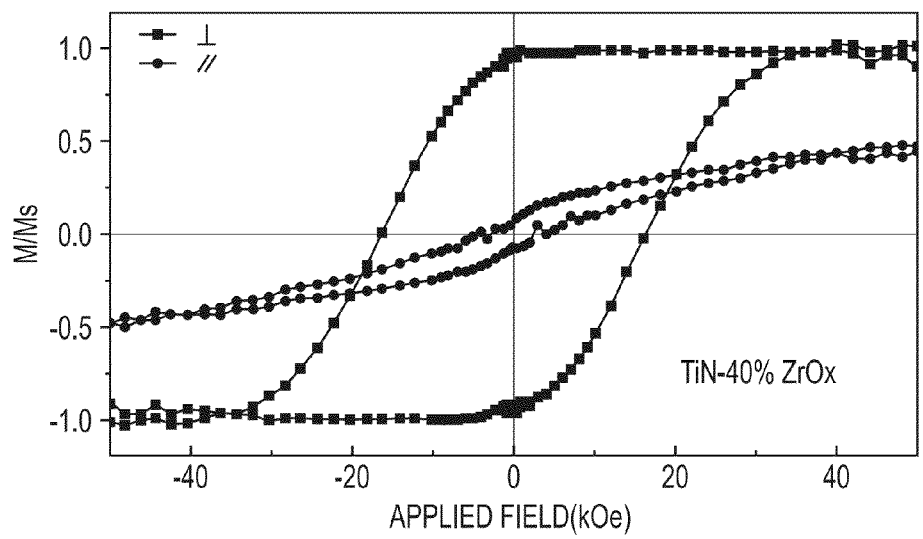

FIGS. 23a and 23b show M-H loops of FePt 4 nm-SiOx 35%-C 20% films on TiN and TiN-30 vol. % $ZrO_x$ interlayers. Similar to the case in TiN—TiOx interlayer, good perpendicular anisotropy of FePt was maintained with introducing ZrOx doping into TiN.

With this TiN—X composed material being used as either intermediate layer directly on silicon/glass substrates or as an intermediate layer disposed on an e.g., a CrRu or MgO underlayer, both microstructure and magnetic properties of FePt L10 (001) textured film can be enhanced, especially the decrease of in-plane hysteresis and reduction of grain size. Moreover, the heat treatment of HAMR media will benefit from the good thermal conductivity of TiN—X underlayer/interlayer.

In comparison with an MgO underlayer/interlayer, TiN—X can provide: a. Conductive nature. TiN—X can be fabricated using dc-sputtering, which has higher deposition rate (throughput rate) and lower chamber contamination than the rf-sputtering of insulate MgO; b. FePt (001) orientation control. The TiN—X is better for FePt epitaxial growth and hence the orientation control due to the wetting of TiN to FePt than non-wetting MgO; c. Enhanced microstructure of TiN—X by doping could more effectively reduce FePt grain size and simultaneously provide an optimal grain shape to achieve high signal to noise ratio; d. The nitrides of the three IV group elements Ti, Zr and Hf have wide chemical composition range and high chemical stability, which is helpful for industrial fabrication and durability; e. The carbides, nitrides and monoxides of Ti, Zr and Hf are isomorphs with similar properties and completely soluble, indicating a good environment adaptability of TiN—X.

Figure 24A:
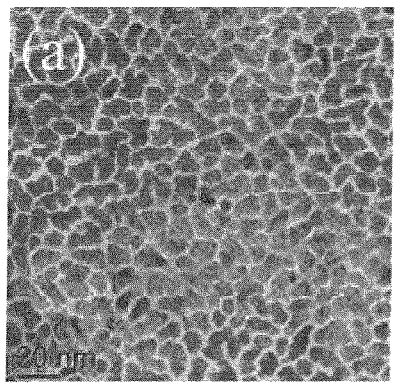
FIG. 24a illustrates a doping concentration of 35% ($SiO_x$)+20% (C)
Figure 24B:
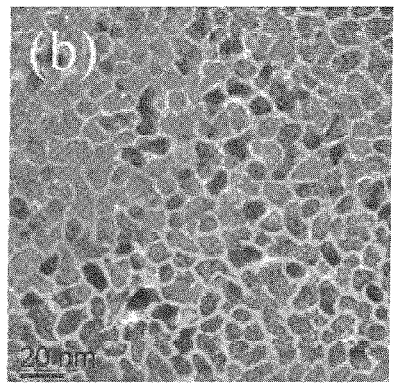
FIG. 24b shows a doping concentration of 40% ($SiO_x$)+20% (C)
Figure 24C:
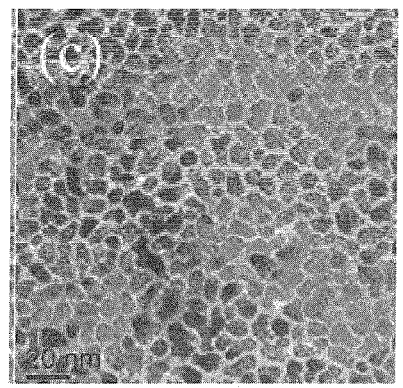
FIG. 24c shows a doping concentration of 45% ($SiO_x$)+25% (C)
Figure 25A:
FIGS. 25a, 25b, and 25c show the cross-sectional TEM images for FIGS. 24a, 24b, and 24c, respectively.
Figure 25B:
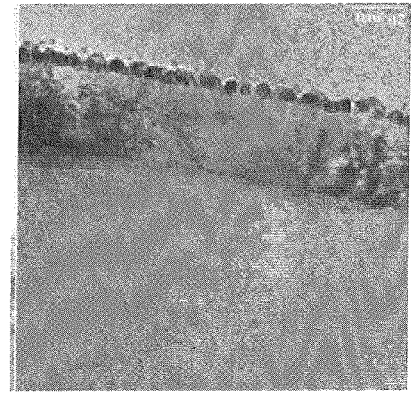
Figure 25C:
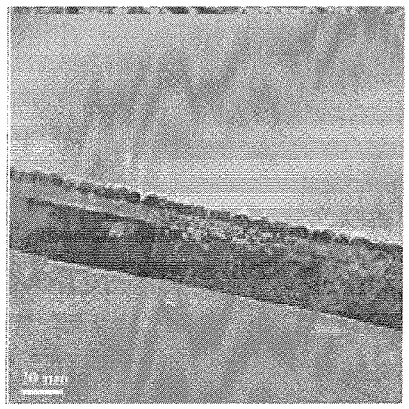
Figure 26A:
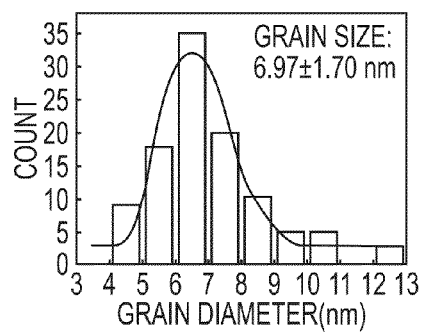
FIGS. 26a, 26b, and 26c are the corresponding grain size distributions for FIGS. 24a, 24b, and 24c, respectively.
Figure 26B:
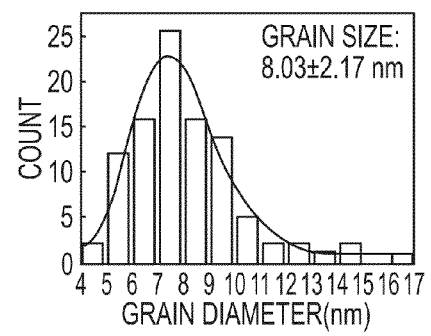
Figure 26C:
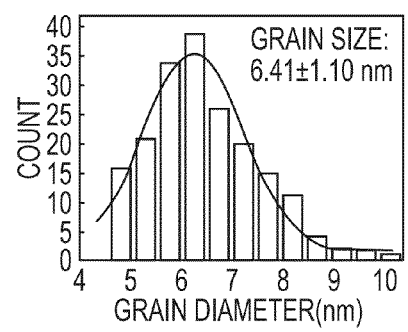

The effect of increased $SiO_x$ and C doping concentrations was investigated to reduce grain size. FIGS. 24a, 24b, and 24c show planar view TEM images of FePt (4 nm)-$SiO_x$—C films grown on TiN—$ZrO_x$ 40 vol. % intermediate layer with different $SiO_x$ and C doping concentrations. FIG. 24a illustrates a doping concentration of 35% ($SiO_x$)+20% (C), FIG. 24b shows a doping concentration of 40% ($SiO_x$)+20% (C). FIG. 24c shows a doping concentration of 45% ($SiO_x$)+25% (C). FIGS. 25a, 25b, and 25c show the cross-sectional TEM images for FIGS. 24a, 24b, and 24c, respectively. FIGS. 26a, 26b, and 26c are the corresponding grain size distributions for FIGS. 24a, 24b, and 24c, respectively. As shown in the above Figures, the grain size increased unexpectedly with $SiO_x$ 40 vol. % and C 20 vol. %, but the grain isolation became better. As illustrated in FIGS. 24c, 25c, and 26c, the grain size was slightly reduced to 6.41±1.10 nm with $SiO_x$ 45 vol. % and C 25 vol. %. From cross-sectional TEM images, single layer structure of FePt with well isolated grains could be observed.

Figure 27:
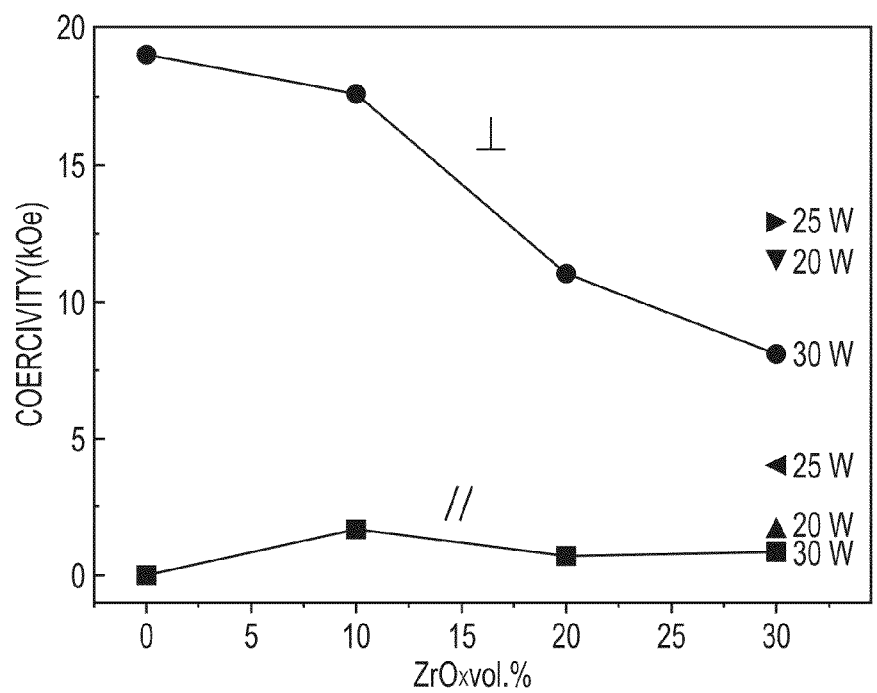
FIG. 27 is a summary of the in-plane and out-of-plane coercivities of FePt.

FIG. 27 is a summary of the in-plane and out-of-plane coercivities of FePt (4 nm, deposited with power 30 W)—$SiO_x$ 35 vol. %-C 20 vol. % films grown on ZrTiON intermediate layers with various ZrOx doping concentrations. For 30% $ZrO_x$, two more samples with different $SiO_x$ and C doping concentrations are presented: 25 W—$SiO_x$ 40 vol. %-C 20 vol. % and 20 W—$SiO_x$ 45 vol. %-C 25 vol. %. The power decrease led to the decreased FePt deposition rate, hence increasing the relative SiOx and C doping concentrations (vol. %) in the FePt layer.

The magnetic properties of all these samples were characterized by a SQUID with an applied field of 7 Tesla. The in-plane (∥) and out-of-plane (⊥) coercivities are summarized in FIG. 27. With increasing $ZrO_x$ doping concentration from 0 to 30 vol. %, out-of-plane coercivity decreased significantly and in-plane coercivity did not significantly change. At 30 vol. % $ZrO_x$, the increase of $SiO_x$ and C doping firstly increased (FePt: 30 W-25 W) and then decreased (FePt: 25 W-20 W) for both the in-plane and out-of-plane coercivities. It may be possible that the high doping concentration of either $ZrO_x$ in TiN or $SiO_x$/C in FePt could result into the degradation of FePt perpendicular anisotropy.

Although ZrTiON enabled the FePt grain size reduction, for high $ZrO_x$ doping levels, the accumulated $ZrO_2$ content could disturb the epitaxial growth and therefore the magnetic properties of FePt granular films. In some embodiments, the ZrTiON layer thickness was reduced to 2 nm to weaken the cumulative effect of $ZrO_2$ induced by $ZrO_x$ doping. Moreover, in some embodiments, a 3 nm TiN intermediate layer was deposited prior to the deposition of ZrTiON. In some cases, TiN layer may enhance the ZrTiON (002) texture, and thus the perpendicular anisotropy of FePt magnetic layer can be enhanced. The crystallinity of ZrTiON may be also enhanced by the reduction of the thickness of the TiN—X layer.

Figure 28A:
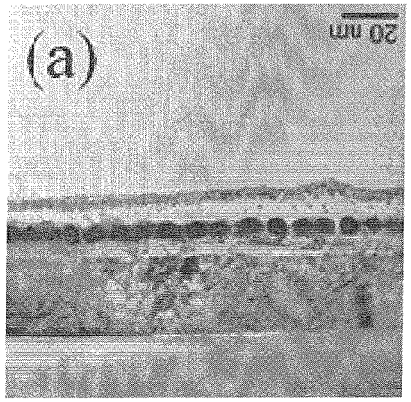
FIG. 28a illustrates a doping concentration of 35% ($SiO_x$)+20% (C)
Figure 28B:
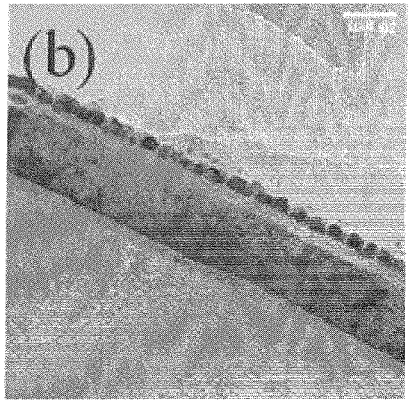
FIG. 28b shows a doping concentration of 40% ($SiO_x$)+20% (C)
Figure 28C:
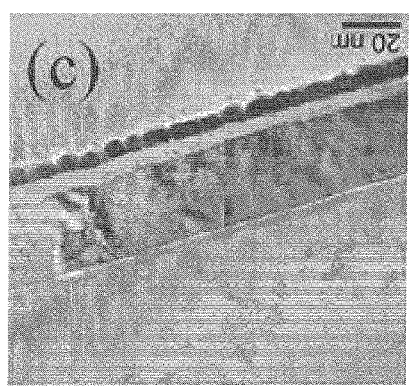
FIG. 28c shows a doping concentration of 45% ($SiO_x$)+25% (C)
Figure 29A:
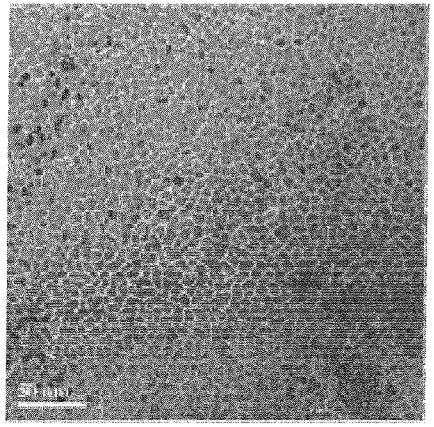
FIGS. 29a, 29b, and 29c show the planar TEM images for FIGS. 28a, 28b, and 28c, respectively.
Figure 29B:
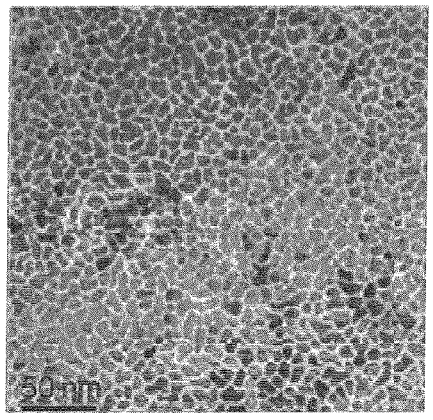
Figure 29C:
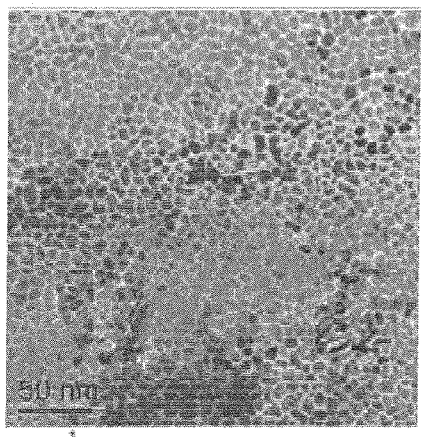
Figure 30A:
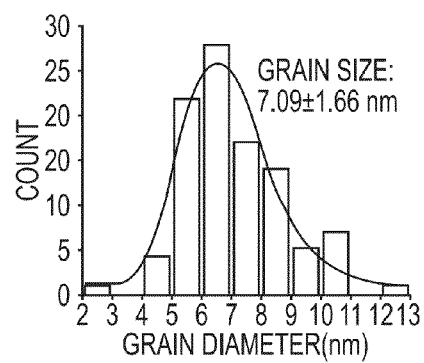
FIGS. 30a, 30b, and 30c are the corresponding grain size distributions for FIGS. 28a, 28b, and 28c, respectively.
Figure 30B:
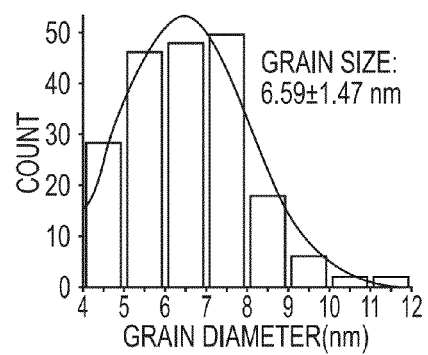
Figure 30C:
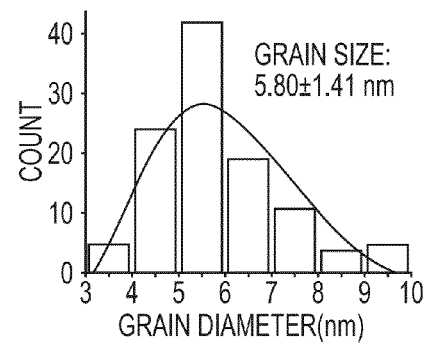

FIGS. 28a, 28b, and 28c show cross-sectional view TEM images of FePt (4 nm)-$SiO_x$—C films grown on TiN (3 nm)/TiN (2 nm)-$ZrO_x$ 30 vol. % combined intermediate layer with different $SiO_x$ and C doping concentrations. FIG. 28a illustrates a doping concentration of 35% ($SiO_x$)+20% (C). FIG. 28b shows a doping concentration of 40% ($SiO_x$)+20% (C). FIG. 28c shows a doping concentration of 45% ($SiO_x$)+25% (C). FIGS. 29a, 29b, and 29c show the planar TEM images for FIGS. 28a, 28b, and 28c, respectively. FIGS. 30a, 30b, and 30c are the corresponding grain size distributions for FIGS. 28a, 28b, and 28c, respectively. The XRD results of the samples were quite similar to that of FePt—$SiO_x$—C ZrTiON/CrRu films discussed previously. Good $L1_0$ (001) texture were achieved for all the samples. TEM measurement was also conducted. The grain size was reduced with increasing $ZrO_x$ doping concentration. The representative results—the microstructure and the corresponding grain size statistics of FePt—$SiO_x$—C films grown on ZrTiON/TiN combined intermediate layer with various $SiO_x$ and C doping concentrations are as shown in FIGS. 28-30. As can be appreciated from FIGS. 30a-c, with the increase of $SiO_x$ vol. % and C vol. %, FePt grain size was reduced from 7.09 nm in FIG. 30a to 5.80 nm in FIG. 30c. The standard deviation of grain size was narrowed from 1.66 nm to 1.41 nm. From cross-sectional TEM images, it can be seen that all these three samples exhibited single layer structure of FePt and FePt grains were well isolated. What is more, all FePt grains exhibited uniform square shape, indicating that the TiN-30 vol. % $ZrO_x$ intermediate layer possessed a moderate surface energy, which can achieve good balance between epitaxial growth and grain size control.

Figure 31A:
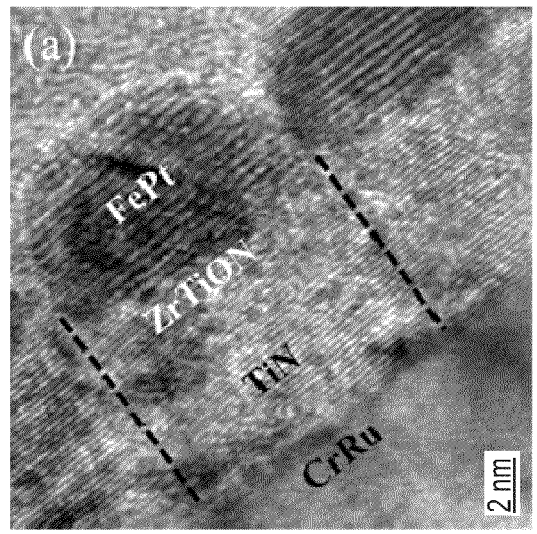
FIGS. 31a, 31b, and 31c show high resolution TEM images of FePt (4 nm)-$SiO_x$ 35 vol. %-C 20 vol. % film grown on TiN (5 nm)-$ZrO_x$ 30 vol. %.
Figure 31B:
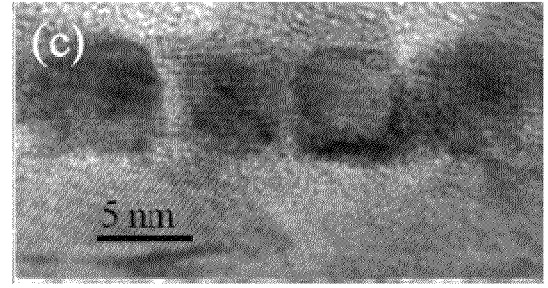
Figure 31C:
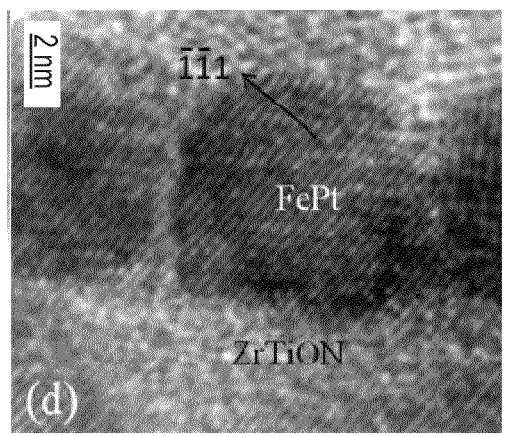

FIGS. 31a, 31b, and 31c show high resolution TEM images of FePt (4 nm)-$SiO_x$ 35 vol. %-C 20 vol. % films grown on both ZrTiON intermediate layer and TiN/ZrTiON combined intermediate layer in accordance with some embodiments. FePt grains showed nearly semispherical shape and relatively larger size when grown on the ZrTiON intermediate layer (FIG. 31a). The columnar structure of ZrTiON intermediate layer can be observed. As indicated by the dashed line in FIG. 31a, segregation of amorphous material at the grain boundaries is observable. The FePt grain matched very well and grew in substantially contiguous one-to-one vertical alignment with ZrTiON grain. The $ZrO_x$ doping in the TiN intermediate layer led to the formation of ZrTiON solid solution grains and amorphous $ZrO_2$ segregation. Thereafter, the FePt grains were formed epitaxially on top of ZrTiON grains. The sample with the TiN and ZrTiON intermediate layers in accordance with some embodiments is shown in FIGS. 31b and 31c. The grains have smaller grain size and larger aspect ratio (height/diameter). These characteristics may be related to the decrease of the $ZrO_2$ content and the enhancement of the ZrTiON crystallinity.

Figures 32A, 32B, 32C:
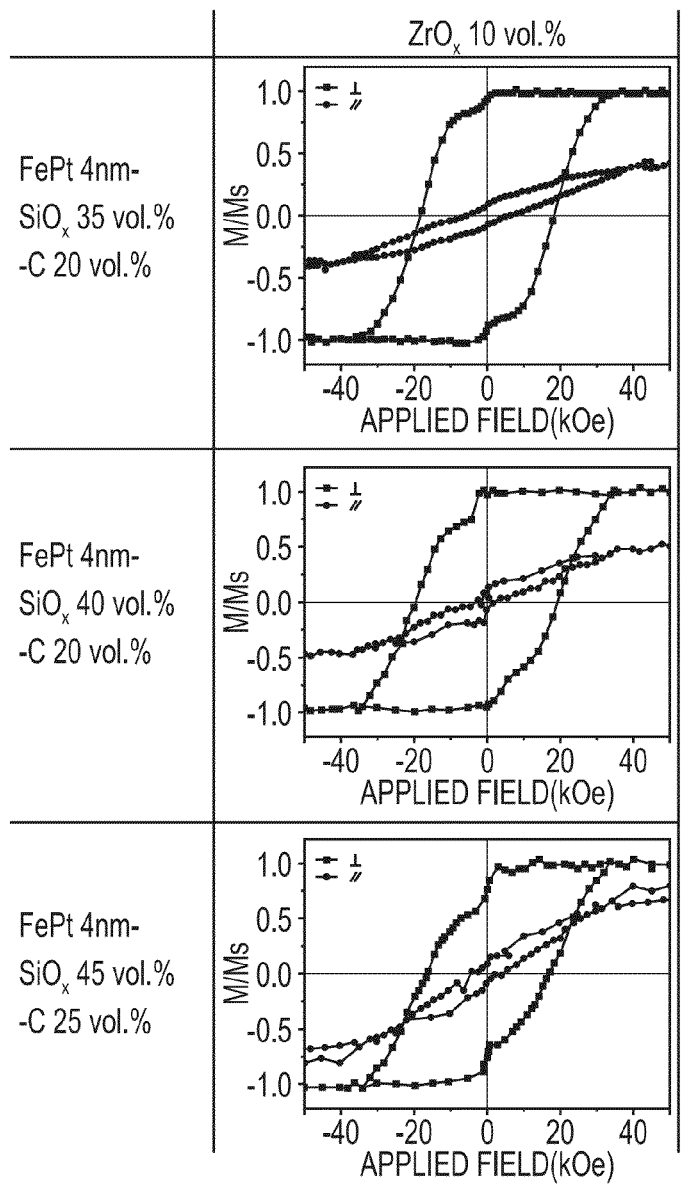
FIGS. 32a, 32b, 32c, 33a, 33b, 33c, 34a, 34b, 34c show in-plane and out-of-plane M-H loops for the FePt samples with various $ZrO_x$ doping concentrations in TiN intermediate layer and various $SiO_x$ and C doping concentrations in FePt layer.
Figures 33A, 33B, 33C:
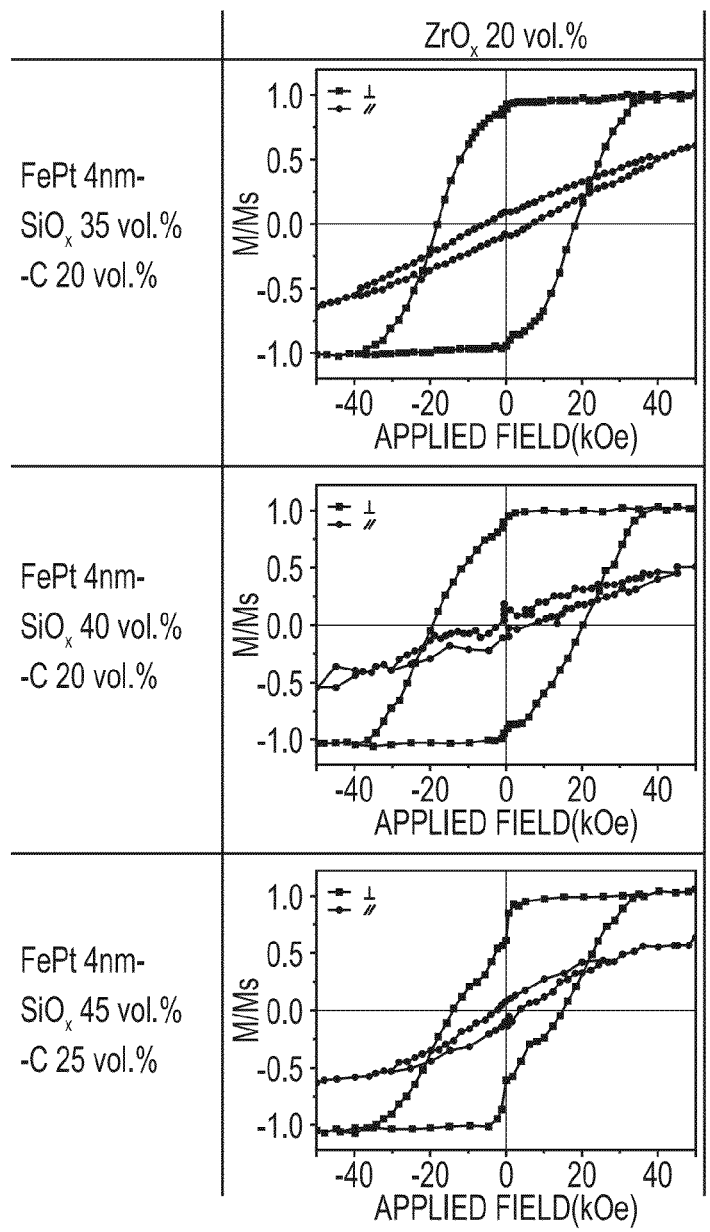
Figures 34A, 34B, 34C:
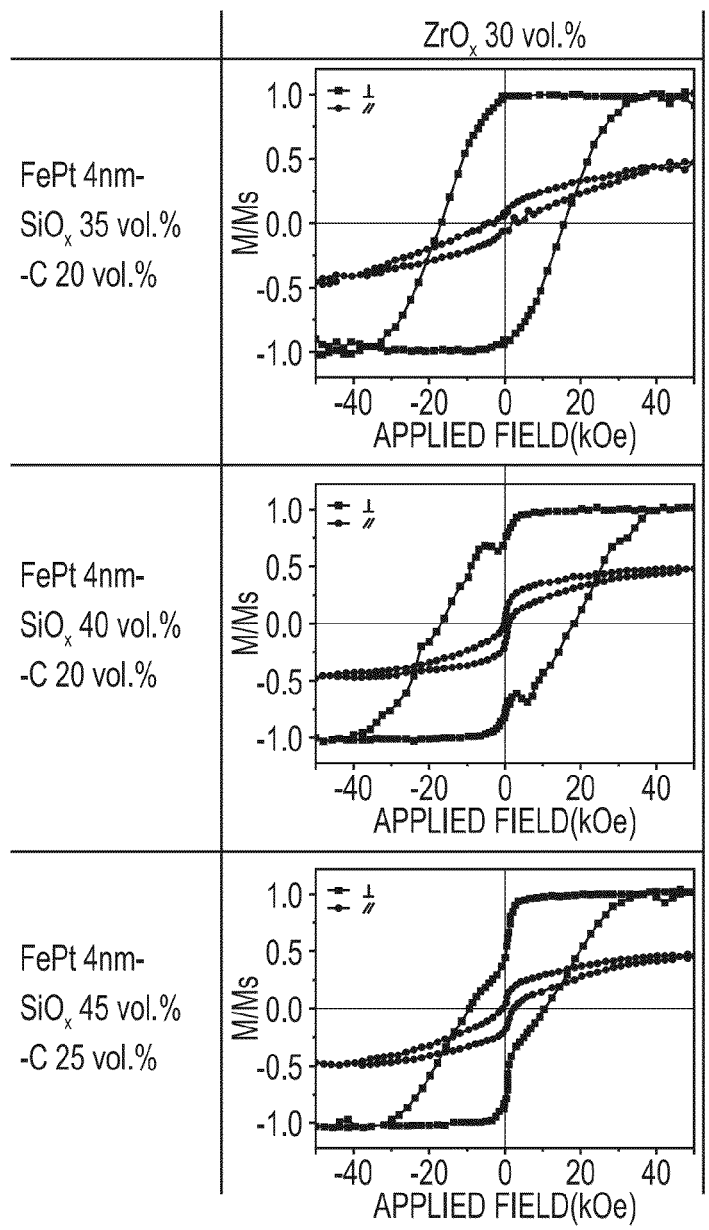

In-plane and out-of-plane M-H loops for the FePt samples with various $ZrO_x$ doping concentrations in TiN intermediate layer and various $SiO_x$ and C doping concentrations in FePt layer are shown in FIGS. 32-34. FIG. 32a illustrates FePt (4 nm)-$SiO_x$ 35 vol. %-C 20 vol. % film grown on TiN (5 nm)-$ZrO_x$ 10 vol. %. FIG. 32b illustrates FePt (4 nm)-$SiO_x$ 40 vol. %-C 20 vol. % film grown on TiN (5 nm)-$ZrO_x$ 10 vol. %. FIG. 32c illustrates FePt (4 nm)-$SiO_x$ 45 vol. %-C 25 vol. % film grown on TiN (5 nm)-$ZrO_x$ 10 vol. %. FIG. 33a illustrates FePt (4 nm)-$SiO_x$ 35 vol. %-C 20 vol. % film grown on TiN (5 nm)-$ZrO_x$ 20 vol. %. FIG. 33b illustrates FePt (4 nm)-$SiO_x$ 40 vol. %-C 20 vol. % film grown on TiN (5 nm)-$ZrO_x$ 20 vol. %. FIG. 33c illustrates FePt (4 nm)-$SiO_x$ 45 vol. %-C 25 vol. % film grown on TiN (5 nm)-$ZrO_x$ 20 vol. %. FIG. 34a illustrates FePt (4 nm)-$SiO_x$ 35 vol. %-C 20 vol. % film grown on TiN (5 nm)-$ZrO_x$ 30 vol. %. FIG. 34b illustrates FePt (4 nm)-$SiO_x$ 40 vol. %-C 20 vol. % film grown on TiN (5 nm)-$ZrO_x$ 30 vol. %. Finally, FIG. 34c illustrates FePt (4 nm)-$SiO_x$ 45 vol. %-C 25 vol. % film grown on TiN (5 nm)-$ZrO_x$ 30 vol. %.

The squareness of out-of-plane M-H loops decreased with increasing $ZrO_x$, $SiO_x$ and C doping. Especially for the films with $ZrO_x$ 30 vol. % or $SiO_x$ 45 vol. %-C 20 vol. %, kinks at zero field were observed. These kinks may be attributed to the soft magnetic phase that was formed by the interdiffusion between FePt and various dopants.

Figure 35:
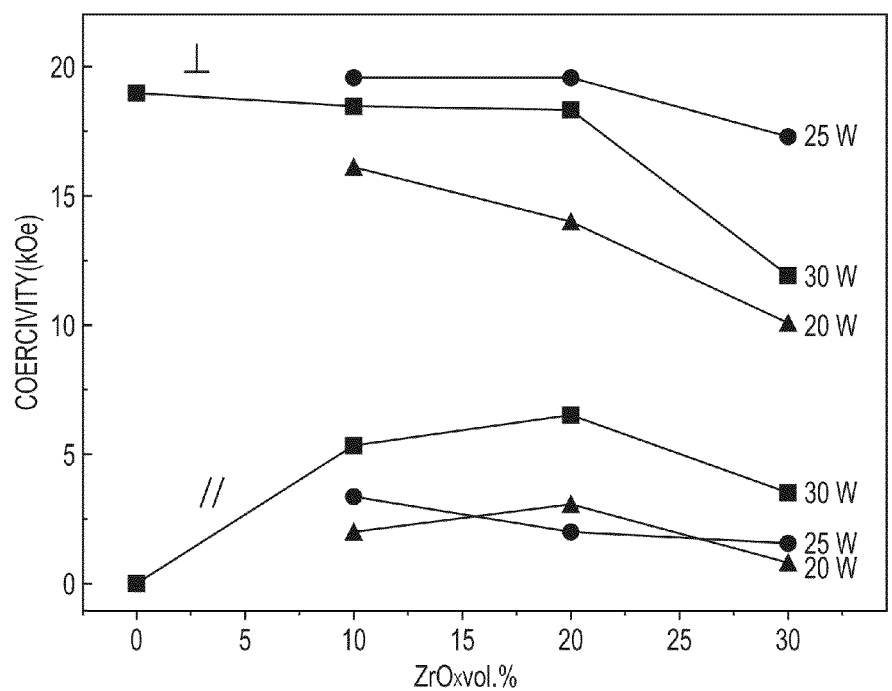
FIG. 35 illustrates the dependence of the in-plane and out-of-plane coercivities on the $ZrO_x$ doping concentration.

The dependence of the in-plane and out-of-plane coercivities on the $ZrO_x$ doping concentration is shown in FIG. 35. The out-of-plane coercivity decreased with increasing doping concentration in not only the TiN intermediate layer but also FePt magnetic layer. The difference is that the sample FePt 4 nm-$SiO_x$ 35 vol. %-C 20 vol. % grown on TiN/TiN—$ZrO_x$ 30 vol. % combined intermediate layer exhibited much better magnetic properties, such as good squareness, large out-of-plane coercivity and small kink, than the same FePt film grown on a TiN—$ZrO_x$ 30 vol. % single intermediate layer. As for in-plane coercivity, it was increased and then decreased. However, it should be noted that although the in-plane coercivity decreased at high $ZrO_x$ doping concentration and $SiO_x$—C doping concentration, it was not caused by the improved perpendicular anisotropy but, on the contrary, it may have been a result of the enormous kink on the M-H loops. FIG. 35 shows the in-plane and out of plane coercivity of FePt 4 nm-$SiO_x$ 35 vol. %-C 20 vol. % sample grown on TiN/TiN—$ZrO_x$ combined intermediate layer, as function of ZrOx doping level. FIG. 35 illustrates that optimal doping level and sputter power achieves high out-of-plane coercivity and low in-plane coercivity.

Comparison of some characteristics of TiN, ZrTiON and TiN/ZrTiON intermediate layers, some of the microstructure, and some magnetic properties for the same FePt (4 nm)-35 vol. % $SiO_x$-20 vol. % C film grown on each of those three intermediate layer are listed in Table 3. Table 3 includes a summary of full width at half maximum (FWHM) $\Delta\Theta_{50}$, out-of-plane coercivity $H_{c\perp}$, in-plane coercivity $H_{c//}$, squareness S, average grain size D, grain size distribution by standard deviation $\sigma(D)$, and slope at coercivity $\alpha$ of FePt (4 nm)-35 vol. % $SiO_x$-20 vol. % C films grown on different intermediate layers. Comparing the information in Table 3 with regard to, TiN and ZrTiON intermediate layers indicates for the ZrTiON layer 1) grain size reduction, 2) grain size uniformity enhancement intermediate layer, 3) the slope at coercivity almost unchanged, 4) slight increase in easy axis dispersion slightly increased, 5) out-of-plane coercivity decreased, 6) in-plane coercivity increased, and 7) squareness decreased from 0.99 to 0.66.

When comparing the ZrTiON intermediate layer to the TiN/ZrTiON intermediate layer, for the TiN/ZrTiON layer, 1) the grain size dispersion was narrowed down, 2) he perpendicular magnetic anisotropy was significantly enhanced, 3) out-of-plane coercivity doubled 4) in-plane coercivity decreased, 5) the squareness was increased to close to 1. For the grain size statistics, the result does not show significant difference between the ZrTiON intermediate layer and the TiN/ZrTiON intermediate layer. Thus, the TiN/ZrTiON combined intermediate layer could effectively diminish the impact of $ZrO_x$ doping on the magnetic properties of FePt and, simultaneously, achieve the benefit of grain size reduction.

TABLE 3

|  | $\Delta\Theta_{50}$ (°) | $H_{c\perp}$ (kOe) | $H_{c//}$ (kOe) | S | D (nm) | $\sigma(D)$ (nm) | $\alpha$ |
|---|---|---|---|---|---|---|---|
| TiN (5 nm) | 6.50 | 16.39 | 0.77 | 0.99 | 11.15 | 3.66 | 1.06 |
| ZrTiON (5 nm) | 7.83 | 8.12 | 0.90 | 0.66 | 6.97 | 1.70 | 1.07 |
| TiN (3 nm)/ ZrTiON (2 nm) | 7.17 | 17.52 | 0.26 | 0.98 | 7.09 | 1.66 | 0.98 |

As discussed herein, in some implementations, TiN—X intermediate layers, such as TiON and ZrTiON intermediate layers, can be fabricated by co-sputtering of TiN and $TiO_2$/$ZrO_2$ in an anoxic circumstance. From XPS and TEM results discussed herein, TiON and ZrTiON intermediate layers were determined to be the solid solution of f.c.c TiN and f.c.c TiO/ZrO, respectively. In comparison with TiN, TiON and ZrTiON intermediate layers have smaller surface energy, thus favoring Volmer-Weber type (island) growth of FePt. Significant grain size reduction in FePt—$SiO_x$—C films grown on TiON or ZrTiON intermediate layers can be achieved. From cross-sectional TEM images, the growth of FePt thin film increasingly inclined to Volmer-Weber (island) model with increasing $TiO_x$ or $ZrO_x$ dopant in TiN—X intermediate layer. According to some embodiments, a combined intermediate layer of TiN/Zr(Ti)ON can be beneficial to the magnetic properties of FePt.

Some embodiments discussed above involve FePt—$SiO_x$—C grown on a TiN-40 vol. % $TiO_x$ intermediate layer. When tested, this configured exhibited well isolated square grains with 90° contact angle in cross-sectional TEM image, providing grain size reduction and thermal stability. Out-of-plane M-H loops of FePt films and FePt—$SiO_x$—C films grown on TiON intermediate layers with various $TiO_x$ doping concentrations maintained almost unchanged. FePt (4 nm)-45 vol. % $SiO_x$-25 vol. % C films grown on TiON intermediate layers with 40 vol. % $TiO_x$ doping exhibited an small and uniform average grain size of 5.65 nm and a high coercivity of 18 kOe. For the FePt—$SiO_x$—C films grown on ZrTiON intermediate layers, the magnetic properties deteriorated with increasing ZrOx concentration, which may be caused by a difference between TiN—$TiO_x$ and TiN—$ZrO_x$ that the former seemed to form solid solution totally while part of the latter formed amorphous $ZrO_2$ content. In some embodiments, a TiN/ZrTiON combined intermediate layer can be used. This configuration may improve magnetic properties and/or grain size. For example, a grain size of 5.80±1.41 nm was obtained for the FePt 4 nm-$SiO_x$ 45 vol. %-C 25 vol. % film grown on TiN/TiN—$ZrO_x$ 30 vol. % combined intermediate layer.

It is to be understood that even though numerous characteristics of various embodiments have been set forth in the foregoing description, together with details of the structure and function of various embodiments, this detailed description is illustrative only, and changes may be made in detail, especially in matters of structure and arrangements of parts illustrated by the various embodiments to the full extent indicated by the broad general meaning of the terms in which the appended claims are expressed.

The invention claimed is:

1. A stack, comprising;
   a substrate;
   a magnetic recording layer; and
   a TiN—X layer disposed between the substrate and the magnetic recording layer, wherein X is a dopant, the TiN—X layer comprising at least about 60% TiN by volume and wherein X is either $TiO_x$ in an amount greater than 0% and less than or equal to about 40% by volume or X is $ZrO_x$ in an amount greater than 0% and less than or equal to about 30% by volume, the TiN—X layer comprising a two phase granular layer having at least one of TiN—X and TiN grains and wherein at least some of the dopant is disposed at grain boundaries between the grains of the TiN—X layer.

2. The stack of claim 1, wherein the magnetic recording layer comprises:
   magnetic crystalline grains comprising at least one of FePt, FeXPt alloy, FePd, FeXPd, $Co_3Pt$; and
   a non-magnetic segregant disposed between the crystalline grains and comprising at least one of an oxide, nitride, boride, and carbide material.

3. The stack of claim 1, wherein X is $TiO_2$ and X is present in the TiN—X layer in an amount greater than 0 and less than or equal to about 40 vol. %.

4. The stack of claim 1, wherein X is $ZrO_2$ and X is present in the TiN—X layer in an amount greater than 0 and less than or equal to about 30 vol. %.

5. The stack of claim 1, wherein:
   X comprises $TiO_2$, and
   the magnetic recording layer comprises magnetic crystalline grains and non-magnetic segregant disposed between the crystalline grains and the crystalline grains have an average diameter in the plane of the magnetic layer that is less than about 8.5 nm.

6. The stack of claim 1, wherein:
   X comprises $ZrO_2$; and the magnetic recording layer comprises magnetic crystalline grains and non-magnetic segregant disposed between the crystalline grains and the crystalline grains have an average diameter in the plane of the magnetic layer that is less than about 6 nm.

7. The stack of claim 1, wherein the magnetic recording layer comprises magnetic crystalline grains of FePt and a non-magnetic segregant comprising $SiO_x$ and C disposed between the crystalline grains, the magnetic layer comprising $SiO_x$ in an amount between about 35 and about 45 vol. % and C in an amount of about 20 vol. %.

8. The stack of claim 1, wherein a thickness of the TiN—X layer less than about 30 nm.

9. The stack of claim 1, further comprising a soft magnetic underlayer comprising one or more of CrRu and MgO, wherein the TiN—X layer is disposed on the soft magnetic underlayer.

10. The stack of claim 9, wherein a thickness of the TiN—X layer is between about 5 nm and about 10 nm.

11. The stack of claim 1, wherein X is TiO2 and the TiN—X layer comprises $TiO_{0.45}N_{0.55}$.

12. The stack of claim 1, further comprising an undoped TiN layer arranged between the substrate and the TiN—X layer.

13. The stack of claim 12, wherein heat conduction through the TiN—X layer normal to the stack surface is greater than lateral heat conduction in the TiN—X layer.

14. The stack of claim 1, wherein an amount of X in the TiN—X layer varies in a direction normal to the stack surface.

15. The stack of claim 14, wherein the TiN—X layer comprises $TiO_yN_{1-y}$, wherein y varies in a direction normal to a surface of the stack.

16. The stack of claim 14, wherein the TiN—X layer comprises $ZrTiO_yN_{1-y}$, wherein y varies in a direction normal to a surface of the stack.

17. A method, comprising:
  forming a TiN—X layer by co-depositing TiN and X, wherein X comprises one of at least one of $TiO_x$ and $ZrO_x$; and
  epitaxially growing an FePt magnetic layer on the TiN—X layer, the TiN—X layer comprising at least about 60% TiN by volume and wherein X is present in the TiN—X in an amount greater than 0% and less than or equal to about 40% by volume, the TiN—X layer comprising a two phase granular layer having at least one of TiN—X and TiN grains and wherein at least some of the dopant is disposed at grain boundaries between the grains of the TiN—X layer.

18. The method of claim 17, further comprising forming a soft magnetic underlayer, wherein the TiN—X layer is grown on a soft magnetic underlayer.

19. The method of claim 17, wherein the soft magnetic underlayer comprises one or more of CrRu and MgO.

20. The method of claim 17, further comprising forming a TiN layer, wherein the TiN—X layer is formed on the TiN layer.

* * * * *